United States Patent
Hassanien et al.

(10) Patent No.: US 11,594,816 B2
(45) Date of Patent: Feb. 28, 2023

(54) ACOUSTICALLY-DRIVEN ELECTROMAGNETIC ANTENNAS USING PIEZOELECTRIC MATERIAL

(71) Applicant: Board of Trustees of the University of Illinois, Urbana, IL (US)

(72) Inventors: Ahmed Hassanien, Savoy, IL (US); Michael Breen, Clarksville, MD (US); Ming-Huang Li, Pingtung County (TW); Songbin Gong, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 77 days.

(21) Appl. No.: 17/249,672

(22) Filed: Mar. 9, 2021

(65) Prior Publication Data
US 2021/0288403 A1    Sep. 16, 2021

Related U.S. Application Data

(60) Provisional application No. 62/987,710, filed on Mar. 10, 2020.

(51) Int. Cl.
| | |
|---|---|
| *H01Q 3/01* | (2006.01) |
| *H01Q 1/38* | (2006.01) |
| *H01Q 1/50* | (2006.01) |
| *H01Q 9/04* | (2006.01) |
| *H03H 9/72* | (2006.01) |

(52) U.S. Cl.
CPC ............... *H01Q 3/01* (2013.01); *H01Q 1/38* (2013.01); *H01Q 1/50* (2013.01); *H01Q 9/0407* (2013.01); *H03H 9/725* (2013.01)

(58) Field of Classification Search
CPC .. H01Q 3/01; H01Q 1/36; H01Q 1/38; H01Q 1/50; H01Q 9/0407
See application file for complete search history.

(56) References Cited

FOREIGN PATENT DOCUMENTS

| CN | 101483272 | | 7/2009 | |
|---|---|---|---|---|
| GB | 2455749 A | * | 6/2009 | ............. H01Q 1/364 |
| GB | 2455749 | | 7/2009 | |
| KR | 1020130107970 | | 10/2013 | |
| WO | WO2009081089 A | * | 7/2009 | ............... H01Q 1/42 |

OTHER PUBLICATIONS

Olsson, R. H., Microsystems Technology Office (MTO) Broad Agency Announcement: A Mechanically Based Antenna (AMEBA) (Document HR001117S0007) Dec. 15, 2016, 41 pages.
(Continued)

*Primary Examiner* — Hoang V Nguyen
(74) *Attorney, Agent, or Firm* — Lowenstein Sandler LLP

(57) ABSTRACT

An antenna includes a piezoelectric disc. The antenna further includes a first electrode disposed on a first surface of the piezoelectric disc and a second electrode disposed on a second surface of the piezoelectric disc that is opposite to the first surface. The first electrode and the second electrode are to receive a time-varying voltage to excite a mechanical vibration in the piezoelectric disc, and the piezoelectric disc is to radiate electromagnetic energy at a particular frequency responsive to the mechanical vibration.

20 Claims, 16 Drawing Sheets

(56) References Cited

OTHER PUBLICATIONS

Singh, H. B. et al., "Submarine Communications," Defense Science Journal, vol. 43 No. 1, Jan. 1993, pp. 43-51.
Yarkan, S. et al., "Underground Mine Communications: A Survey," IEEE Commun. Surv. Tutor. vol. 11 No. 3, (2009) pp. 125-142.
Wheeler, H. A., "Fundamental Limitations of a Small VLF Antenna for Submarines," IRE Transactions on Antennas and Propagation 6(1), 1958, pp. 123-125.
Waheed-Uz-Zaman, M et al., "Design and Construction of Very Low Frequency Antenna," Journal of Basic & Applied Sciences 7(2), 141-145 (2011).
Ashdown, G. A., "Study of a VLF distributed Antenna Array," In In AGARD, ELF/VLF/LF Radio Propagation and Systems Aspects (See N93-30727 11-32), 1993, 24 pages.
Simpson, T., "Developing a Broadband Circuit Model for the Cutler VLF Antenna," IEEE Antennas and Propagation Society International Symposium, vol. 4, 250-253 (2001).
Wheeler, H. A., "Fundamental Limitations of Small Antennas," Proceedings of the IRE 35, Dec. 1947, pp. 1479-1484.
Chu, L. J., "Physical limitations of omni-directional antennas. Journal of Applied Physics," 19, 27, May 1948, pp. 1163-1175.
Collin, R., et al., "Evaluation of Antenna Q," IEEE Transactions on Antennas and Propagation, Jan. 12, 1964, pp. 23-27.
Hansen, R. C., "Fundamental limitations in Antennas," Proceedings of the IEEE vol. 69, No. 2, Feb. 1981, pp. 170-182.
McLean, J. S., "A Re-Examination of the Fundamental Limits on the Radiation Q of Electrically Small Antennas," IEEE Transactions on Antennas Propagation, vol. 44, No. 5, May 1996, pp. 672-676.
Mindlin, R. D. "Electromagnetic Radiation from a Vibrating Quartz Plate," Int. J. Solids Structures, vol. 9, Pergamon Press, Great Britain, 1973, pp. 697-702.
Lee, P. C. Y., Electromagnetic Radiation from Doubly Rotated Piezoelectric Crystal Plates Vibrating at Thickness Frequencies. Journal of Applied Physics, vol. 67, Feb. 12, 1990, pp. 6633-6642.
Domann, J. P. et al., "Strain Powered Antenna," Journal of Applied Physics, vol. 121, Jan. 17, 2017, 044905, 8 pages.
Nan, T. et al., "Acoustically actuated ultra-compact NEMS magnetoelectric antennas," Nature Communications, vol. 8, 2017, 8 pages.
Yao Z. et al., "Bulk Acoustic Wave-Mediated Multiferroic Antennas: Architecture and Performance Bound," IEEE Transactions on Antennas and Propagation, vol. 63, No. 8, Aug. 2015, pp. 3335-3344.
Kemp, M. A. et al., "A high Q piezoelectric resonator as a portable VLF transmitter," Nature Communications, vol. 10, 2019, 7 pages.
Larson, J. D. et al., "Modified Butterworth-Van Dyke Circuit for FBAR Resonators and Automated Measurement System," Proc. IEEE Ultrasonics Symposium 1, 2000, pp. 863-868.
Piazza, G. et al., "Piezoelectric Aluminum Nitride Vibrating Contour-Mode MEMS Resonators," Journal of Microelectrochemical System, vol. 15, Dec. 2006, pp. 1406-1418.
Clark, J. R. et al., "High-Q UHF Micromechanical Radial-Contour Mode Disk Resonators," Journal of Microelectromechanical Systems, vol. 14, No. 6, Dec. 2005, pp. 1298-1310.
Wang, J. et al., "1.156-GHz Self-Aligned Vibrating Micromechanical Disk Resonator," IEEE Transactions on Ultrasonics, Ferroelectics, and Frequency Control, vol. 51, No. 12, Dec. 2004, pp. 1607-1628.
Rajan, K.K. et al., "Dielectric and piezoelectric properties of [0 0 1] and [0 1 1]-poled relaxor ferroelectric PZN-PT and PMN-PT single crystals," Sensors Actuators A Physical, 133, 2007, pp. 110-116.
Zhang, S. et al., "Characterization of Mn-modified Pb (Mg13Nb23)O3—PbZrO3—PbTiO3 single crystals for high power broad bandwidth transducers," Applied Physics Letters, 93, 122908, 2008, 4 pages.
PI Piezo Technology, https ://www.picer amic.com/en/, 9 pages.
Rowen J. H. et al., "Generation of Microwave Electromagnetic Radiation in Magnetic Materials," Journal of Applied Physics, vol. 32, No. 3, 1961, pp. 313S-315S.

R. M. Fano, "Theoretical Limitations on the Broadband Matching of Arbitrary Impedances," Massachusetts Institute of Technology, Research Laboratory of Electronics, Technical Report No. 41, Jan. 1950, pp. 57-83.
Maines, J. D. et al., "Surface-Acoustic-Wave Devices for Signal Processing Applications," Proceedings of the IEEE, vol. 64, No. 5, May 1976, pp. 639-652.
Campbell, C., "Applications of Surface Acoustic and Shallow Bulk Acoustic Wave Devices," Proceedings of the IEEE vol. 77, No. 10, Oct. 1989, pp. 1453-1484.
Lu R. et al., "A Radio Frequency Nonreciprocal Network Based on Switched Acoustic Delay Lines," IEEE Transactions on Microwave Theory and Techniques, vol. 67, No. 4, Apr. 2019, pp. 1516-1530.
Shahpari, K. et al., "Fundamental Limitations for Antenna Radiation Efficiency," IEEE Transactions on Antennas and Propagation, vol. 66, No. 8, Aug. 2018, pp. 3894-3901.
Prasad, M. N. S. et al., "Directly Modulated Spinning Magnet Arrays for ULF Communications," IEEE Radio and Wireless Symposium (RWS), IEEE, 2018, pp. 171-173.
Golkowski, M. et al., "Novel Mechanical Magnetic Shutter Antenna for ELF/VLF Radiation," 2018 IEEE International Symposium on Antennas and Propagation and USNC-URSI Radio Science Meeting, APSURSI, 2018, pp. 65-66.
Diaz-Ballester, A. et al., "Charge Storage and Retention in Electret Dielectric Layers for Energy Harvesting Applications," in 2014 IEEE 9th Iberoamericana Congress Sensors, IEEE, 2014, 4 pages.
Künstler, W. et al., "Piezoelectricity of Porous Polytetrafluoroethylene Single-and-Multiple-Film electrets Containing High Charge Densities of Both Polarities," Applied Physics Materials Science & Processing 70, 2000, pp. 5-8.
Suzuki, Y., "Development of a MEMS Energy Harvester with High-Performance Polymer Electrets," Department of Mechanical Engineering, Tokyo, Japan , 6 pages.
Mescheder, U. et al., Properties of SiO2 Electret Films Charged by Ion Implantation for MEMS-based Energy Harvesting Systems, Journal of Micromechanics and Microengineering, 19, 2009, 7 pages.
Asanuma, H., "Ferroelectric Dipole Electrets for Output Power Enhancement in Electrostatic Vibration Energy Harvesters," Applied Physics Letters, 103, 2013, 162901, 5 pages.
Best, S. et al., "A Performance comparison of Fundamental Small-Antenna Design," The MITRE Corporation, IEEE, Bedford, MA, 2010, 24 pages.
Pfeiffer, C. et al., "Fundamental Efficiency Limits for Small Metallic Antennas," Transactions on Antennas and Propagation, vol. 65, No. 4, Apr. 2017, 9 pages.
Hassanien, A.E. et al., "Acoustically Driven and Modulation Inducible Radiating Elements," University of Illinois at Urbana-Champaign, 2019, 12 pages.
Shannon, C.E., "A Mathematical Theory of Communication," The Bell System Technical Journal, vol. 27, July, Oct. 1948, 55 pages.
Guertler, R., "Impedance Transformation in Folded Dipoles," Proceedings of the I.R.E, Sep. 1950, 6 pages.
Best, S.R., "The Radiation Properties of Electrically Small Folded Spherical Helix Antennas," IEEE Transactions on Antennas and Propagation, vol. 52, No. 4, Apr. 2004, 8 pages.
Best, S.R., "Low Q Electrically Small Linear and Elliptical Polarized Spherical Dipole Antennas," IEEE Transactions on Antennas and Propagation, vol. 53, No. 3, Mar. 2005, 7 pages.
Thal, Herbert L. Jr., "New Radiation Q Limits for Spherical Wire Antennas," Life Fellow, IEEE Transactions on Antennas and Propagation, vol. 54, No. 10, Oct. 2006, 7 pages.
Adams, J.J. et al., "Comparison of Spherical Antennas Fabricated via Conformal Printing: Helix, Meanderline, and Hybrid Designs," IEEE Antennas and Wireless Propagation Letters, vol. 10, 2011, 4 pages.
Erentok, Aycan et al., "Metamaterial-Inspired Efficient Electrically Small Antennas," IEEE Transactions on Antennas and Propagation, vol. 56, No. 3, Mar. 2008, 17 pages.
Pfeiffer, C. et al., "Direct Transfer Patterning of Electrically Small Antennas onto Three-Dimensionally Contoured Substrates," Advanced Materials, Verlag GmbH & Co. KGaA, Weinham, 2012, 24, 5 pages.

(56) References Cited

OTHER PUBLICATIONS

Jelinek, L. et al., "Radiation Efficiency Cost of Resonance Tuning," IEEE Transaction on Antennas and Propagation, vol. 66, No. 12, Dec. 2018, 6 pages.
Gustafsson, M. et al., "Tradeoff Between Antenna Efficiency and Q-Factor," IEEE Transactions on Antennas and Propagation, vol. 67, No. 4, Apr. 2019, 12 pages.
Park, K.K. et al., "Zero-Bias Resonant Sensor with an Oxide-Nitride Layer as Charge Trap," IEEE Sensors, 2010, 5 pages.
Boisseau, S. et al., "New DRIE-Patterned Electrets for Vibration Energy Harvesting," EPJ Web of Conferences, 2012, 8 pages.
Lowke, J.J., "Theory of Electrical Breakdown in air-the Role of Metastable Oxygen Molecules," Journal of Physics D: Applied Physics, 25, 1992, 10 pages.
Malik, N.H. et al., "A Review of Electrical Breakdown in Mixtures of $SF_6$ and Other Gases," IEEE Trans. Electr. Insul, vol. El-14 No. 1, Feb. 1979, 13 pages.
Yang, Yao-Joe et al., "Effect of Air Damping on the Dynamics of Nonuniform Deformations of Microstructures," Transducers 1997, Proceedings of International Conference on Solid-State Sensors and Actuators, Chicago, IL, Jun. 16-19, 1997, 4 pages.
Mol, L. et al., "Squeezed Film Damping Measurements on a Parallel-Plate MEMS in the Free Molecule Regime," Transducers 2009—15th International Conference on Solid-State Sensors, Actuators and Microsystems, Denver, CO, USA, Jun. 21-25, 2009, 4 pages.
Draughn, R.A. et al., "Effect of Low Pressure on Surface Charge of Electrets," Journal of Electrochemical Society, vol. 115, No. 4, Apr. 1968, 5 pages.
Ballato, A. et al., "Advances in High-Q Piezoelectric Resonator Materials and Devices," IEEE Transactions on Ultrasonics, Ferroelectrics and Frequency Control, vol. 41, No. 6, Nov. 1994, 11 pages.
Yang, Y. et al., "5 GHz Lithium Niobate MEMS Reasonators with High FOM of 153," IEEE 30th International Conference on Micro Electro Mechanical Systems, Las Vegas, NV, USA, Jan. 22-26, 2017, 4 pages.
Bechmann, R., "Elastic and Piezoelectric Constants of Alpha-Quartz," Physical Review, vol. 110 No. 5, Jun. 1, 1958, 2 pages.
Chandorkar, S.A. et al., "Limits of Quality Factor in Bulk-Mode Micromechanical Resonators," Proceedings of the IEEE International Conference on Micro Electro Mechanical Systems, Tucson, AZ, USA, Jan. 13-17, 2008, 4 pages.
Zouache, N. et al., "Electrical Breakdown of Small Gaps in Vacuum," IEEE Transactions on Dielectrics and Electrical Insulation, vol. 4, No. 4, Aug. 1992, 7 pages.
Emad, A. et al., "Resonant Torsional Micro-Actuators Using Thin-Film Lithium Niobate," MEMS 2019, Seoul, Korea, Jan. 27-31, 2019, 4 pages.
Kim, Byong Joo et al., "Fabrication of Thick Periodically-poled Lithium Niobate Crystals by Standard Electric Field Poling and Direct Bonding," Journal of Optical Society of Korea, vol. 14, No. 4, Dec. 2010, 4 pages.
Camlibel, I., "Spontaneous Polarization Measurements in Several Ferroelectric Oxides Using a Pulsed-Field Method," Journal of Applied Physics, vol. 40, No. 4, Mar. 15, 1960, 5 pages.
Ro, Jung Hoon, et al., "Non-Stoichiometric Defect Effect on Coercive Field in Lithium Niobate Crystals," Ferroelectrics, vol. 269, 2002, 7 pages.
Asanuma, H., et al., "A Spontaneous Polarization Electret for Electrostatic Vibration Energy Harvesting," Transducers and Eurosensors XXVII, Barcelona, Spain, Jun. 16-20, 2013, 4 pages.
Gemant, A. "Electrets," Physics Today, 2, Mar. 1949, 7 pages.
Kang, Min-Gyu et al., "Recent Progress on PZT Based Piezoelectric Energy Harvesting Technologies," Actuators, 5, 2016, 17 pages.
Yang, Zhengbao et al., "Comparison of PZN-PT, PMN-PT Single Crystals and PZT Ceramic for Vibration Energy Harvesting," Energy Conversion and Management, 122, 2016, 9 pages.
Barani, N. et al., "Mechanical Antennas: Emerging Solution for Very-Low Frequency (VLF) Communication," IEEE International Symposium on Antennas , APSURSI 2018, 2 pages.

* cited by examiner

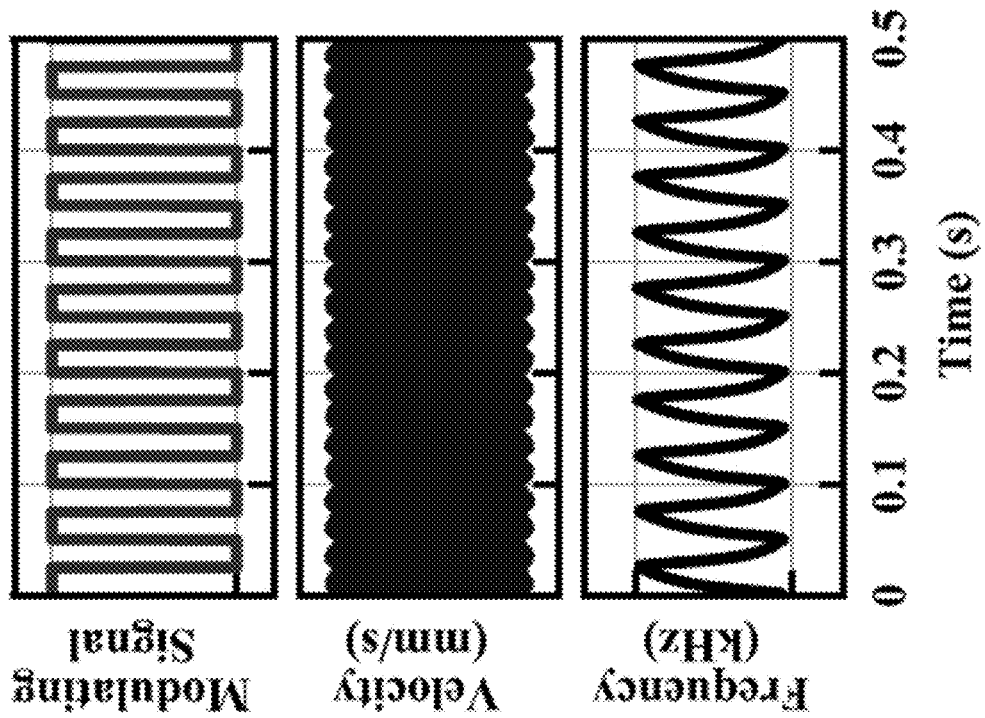
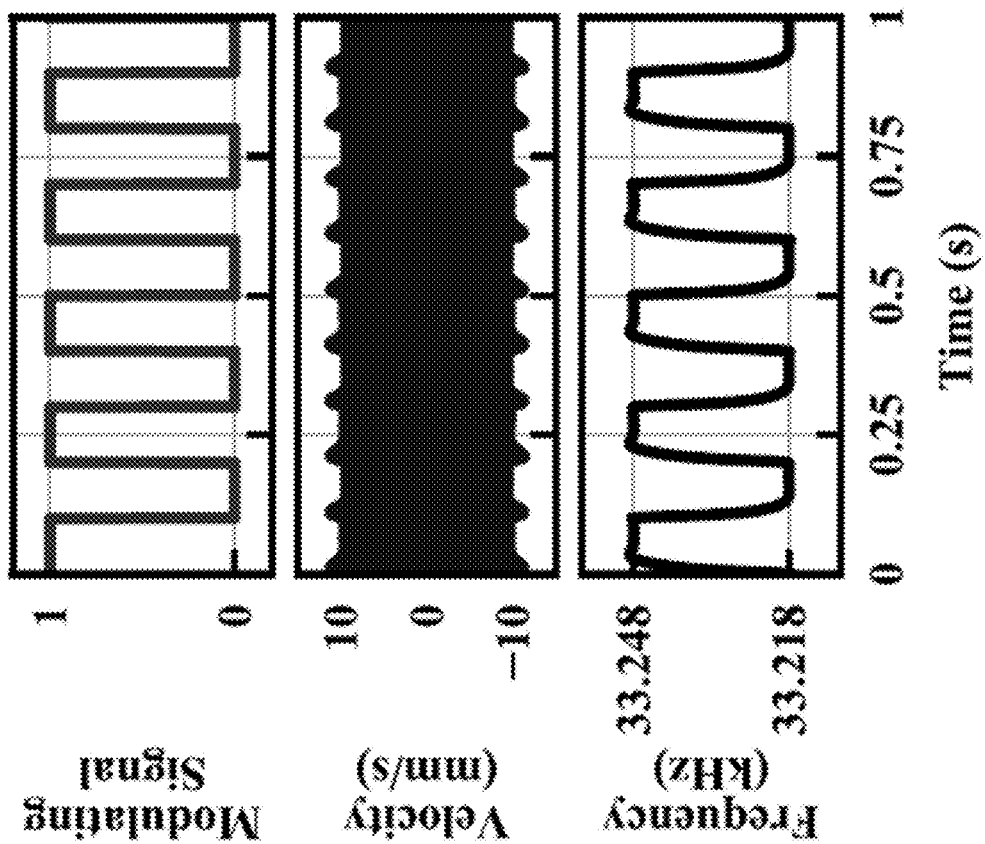
FIG. 13A
FIG. 13B

US 11,594,816 B2

ACOUSTICALLY-DRIVEN ELECTROMAGNETIC ANTENNAS USING PIEZOELECTRIC MATERIAL

RELATED APPLICATIONS

This application claims the benefit under 35 U.S.C. § 119(e) of U.S. Provisional Patent Application No. 62/987,710, filed Mar. 10, 2020, which is incorporated herein by this reference in its entirety.

FEDERALLY SPONSORED RESEARCH OR DEVELOPMENT

This disclosure was made with government support under Grant No. HR0011-15-C-0008 awarded by the Defense Advanced Research Projects Agency (DARPA). The government has certain rights in the invention.

TECHNICAL FIELD

Embodiments of the disclosure relate generally to an acoustically-driven antenna, and more specifically, configuring a low-frequency antenna with an acoustic resonator made of a high-permittivity piezoelectric material.

BACKGROUND

While antennas are ubiquitous in modern electronic devices, low frequency antennas, like those designed to operate at a frequency of less than 40 kilohertz (kHz), have been too inefficient to be viable and are difficult to implement due to their large size. Smaller antennas exhibit large reactive impedances resulting in a large impedance mismatch with a driving source.

BRIEF DESCRIPTION OF THE DRAWINGS

A more particular description of the disclosure briefly described above will be rendered by reference to the appended drawings. Understanding that these drawings only provide information concerning typical embodiments and are not therefore to be considered limiting of its scope, the disclosure will be described and explained with additional specificity and detail through the use of the accompanying drawings.

FIG. 13A is a series of corresponding graphs illustrating (from top to bottom) a modulating signal, a measured velocity, and a demodulated signal of a measured FSK data rate of 5 Hz based on an electromagnetic signal received from the piezoelectric antenna using a signal source analyzer (SSA) according to some embodiments.

FIG. 13B is a series of corresponding graphs illustrating (from top to bottom) a modulating signal, a measured velocity, and a demodulated signal of a measured FSK data rate of 20 Hz based on an electromagnetic signal received from the piezoelectric antenna using the SSA according to some embodiments.

DETAILED DESCRIPTION

Figure 1A:
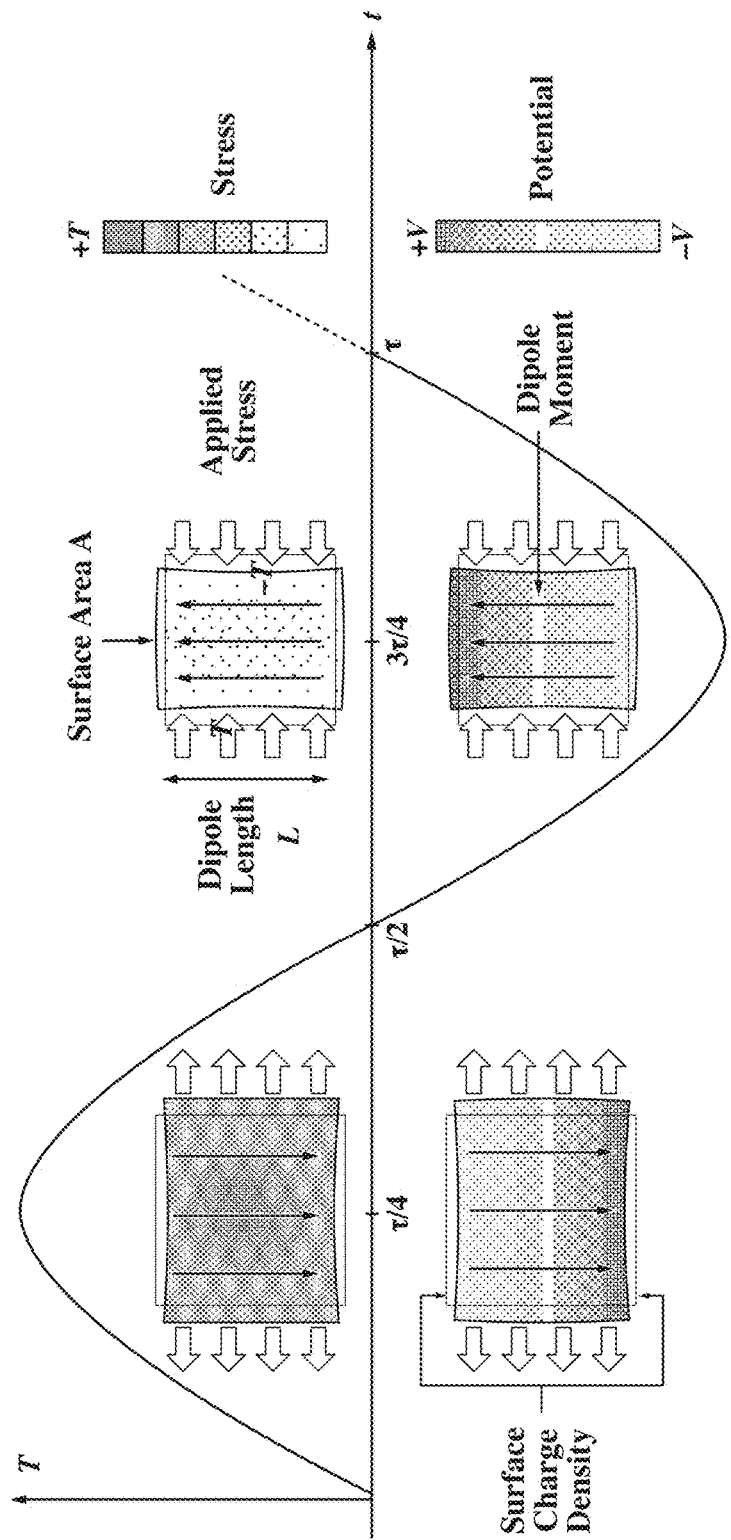
FIG. 1A is a graph illustrating a time-varying electrical polarization of an acoustically-driven and modulation-inducible radiating element with an applied time-varying mechanical stress according to embodiments.

The low propagation loss of electromagnetic radiation below 1 megahertz (MHz) offers significant opportunities for low power, long range communication systems to meet growing demand for Internet of Things (IoT) applications as well as military applications that call for communications that are reliable and cannot be jammed. However, the fundamental reduction in efficiency as antenna size decreases below a wavelength (30 meters (m) at 1 MH) has made portable communication systems in the very low frequency (VLF: 3-30 kilohertz (kHz)) and low frequency (30-300 kHz) ranges impractical for decades. A paradigm shift to piezoelectric antennas utilizing strain-driven currents at resonant wavelengths up to five orders of magnitude smaller than electrical antennas offers the promise for orders of magnitude efficiency improvement over the electrical state-of-the-art antennas. This disclosure demonstrates a lead zirconate titanate (PZT) transmitter greater than 6000 times more efficient than a comparably sized electrical antenna and capable of bit rates up to 60 bits per second (bit/s). Detailed analysis of design parameters offers a roadmap for significant future improvement in both radiation efficiency and data rate.

Portable wireless devices have become ubiquitous over the last decade, and with the growth of IoT devices, demand for small, efficient wireless communication systems continues to accelerate. While the development of wireless systems has kept pace with demand at higher frequencies, implementation of portable low-frequency systems has remained impractical for nearly a century. Extreme inefficiency as electrical antennas are scaled to compact sizes and limited data rates due to limited antenna bandwidths have resulted in mobile wireless communication to be developed almost exclusively at much higher frequencies. Compact antennas at the very high frequency (VHF or 30-300 MHz) and ultra-high frequency (VHF or 300-3000 MHz) are well developed and suited for transmitting data at high bit rates. However, increased spectral crowding and relatively large propagation loss in those bands make them unsuitable for widespread arrays of remote, low power sensors in rural areas or long-range communication elements over rugged terrain desirable for (IoT) or defense applications.

Compared to VHF and UHF signals, radiation at the ultra-low (ULF or 0.3-3 kHz) and very low frequency (VLF or 3-30 kHz) ranges exhibits relatively low propagation loss, enabling communication underwater up to 20 $m^2$ and through hundreds of feet of earth. Additionally, VLF radiation can propagate as ground waves that reflect back and forth between the Earth's surface and ionosphere with very low atmospheric attenuation of approximately 2-3 dB/100 km. Such propagation properties make VLF communication well suited for applications where distance or line-of-sight limitations make higher frequency portable systems unviable and high data rates are less valuable than reliable, long-distance communication. Development of sensor arrays such as remote moisture detectors spread over large forested areas to detect wildfires or emergency text or voice communication in inaccessible terrain benefit greatly from operating at VLF frequencies without being capped by the limited bandwidth. However, while the desirable propagation properties ensure continued demand for portable, long-range VLF transmitters, use of VLF antennas has been largely restricted to submarines and large base installations such as the VLF transmitter in Cutler, Me., which spans an entire island.

Despite decades of investigation, compact antennas in the VLF and low frequency (LF 30-300 kHz) bands have remained an unattainable implementation considered impractical due to the fundamental tradeoff between antenna efficiency and electrical size. Efficient electrical antennas require operation near electromagnetic resonance, typically restricting the physical size to be larger than one-tenth of a wavelength ($\lambda/10$). Previously conducted fundamental analysis on the tradeoff between antenna size and efficiency has defined a size limit for an efficient electrically small antenna (ESA). Decreasing the size of an ESA below that limit results in a diminished radiation resistance, which leads to a low radiation efficiency as resistive losses begin to dominate. Furthermore, as the size of electrical antennas becomes much smaller than the wavelength ($\lambda$), the reactive component of the antenna impedance becomes increasingly large. The small radiation resistance in conjunction with the much larger antenna reactance results in a large impedance mismatch with the driving electronics. Tuning out the large reactance to improve the matching efficiency requires an impedance matching circuit, but for frequencies below 1 MHz, the large size and lossy nature of the matching circuit have made ESAs impractical to implement.

In various embodiments, piezoelectric resonant acoustic antennas are considered to surpass the inefficiency of ultra-sub wavelength ESAs required for portable VLF communication. For example, piezoelectric transmitters couple mechanical vibration into electrical radiation. Acoustic waves propagate at velocities $10^5$ times lower than electromagnetic waves, enabling resonant operation for mechanical antennas at frequencies five orders of magnitude lower than similar sized electrical counterparts. Resonant impedances of acoustically-driven antennas can be easily matched to driving electronics, removing the need for bulky, inefficient matching circuits.

This disclosure will demonstrate an acoustically-driven and modulation-inducible radiating element (ADMIRE) using a high-permittivity piezoelectric material and integrated within a piezoelectric antenna. The high-permittivity piezoelectric material can be, for example, lead zirconate titanate (PZT) or magnesium niobate, lead titanate (PMN-PT). Such piezoelectric material can redefine VLF transmitters by exceeding the matched efficiency of ESAs by orders of magnitude and demonstrating novel shaping of near and far-field regions using the high-permittivity materials. In some embodiments, an electrode is disposed on opposing surfaces of a piezoelectric disc although other geometries are envisioned, which will be discussed. This pair of electrodes are to receive a time-varying voltage to excite a mechanical vibration in the piezoelectric disc. The piezoelectric disc is to radiate electromagnetic energy at a particular frequency responsive to the mechanical vibration. While the presented matched antenna efficiency is already more than 6000 times efficient than that of an equivalently sized ESA, the disclosed piezoelectric antenna can (and is expected) to be further improved in efficiency. A full analysis of the design space for piezoelectric antennas is detailed, paving the way for the subsequent development of compact, high-efficiency piezo-transmitters with the potential for widespread use in low-frequency wireless communication systems.

Figure 1B:
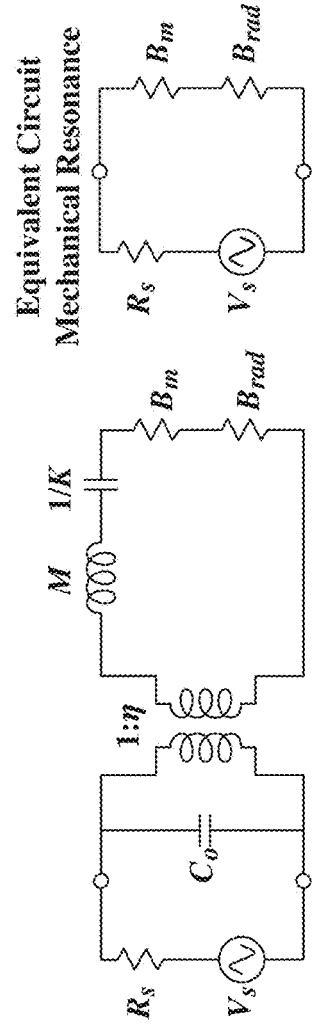
FIG. 1B is a schematic diagram of a Butterworth Van-Dyke equivalent circuit model of the radiating element of FIG. 1A according to embodiments.

FIG. 1A is a graph illustrating a time-varying electrical polarization of an acoustically-driven and modulation-inducible radiating element with an applied time-varying mechanical stress according to embodiments. FIG. 1B is a schematic diagram of a Butterworth Van-Dyke equivalent circuit model of the radiating element of FIG. 1A according to embodiments. Acceleration of charges, including dipole moment flipping, results in far-field electromagnetic (EM) radiation with field components that are inversely proportional to the distance traveled away from the radiating element. Using this concept, any element that contains a time-varying dipole moment, such as the acoustically-excited piezoelectric materials described herein, can be considered a radiating element. Piezoelectric materials lack inversion symmetry within their crystalline structure, resulting in a linear coupling between the electrical and the mechanical domain parameters via the reversible piezoelectric effect. In particular, the direct piezoelectric effect is the electrical polarization produced by an applied mechanical stress, which can come from an applied voltage. For a time-varying stress, radiation is produced with the time-varying electrical polarization.

In FIG. 1A, a sinusoidal force, with period $\tau$, is exerted on a piezoelectric material resulting in electric polarization with surface charge density $\sigma_q$, which can be calculated using the piezoelectric constitutive equations as follows:

$$\sigma_q = dT = dC^E S, \quad (1)$$

$$I = \sigma_q A \omega = dC^E S A \omega, \quad (2)$$

where d is the piezoelectric strain constant, T is the applied stress, $C^E$ is the stiffness at constant electric field and S is the resulting strain. Equation (1) assumes an average strain throughout the entire volume of the piezoelectric material for simplicity, which provides the effective modal response in the dynamic excitation case. The effective dipole current is calculated in Equation (2), where A is the surface area of the accumulated charges and $\omega$ is the angular frequency of the applied stress. The generated magnetic field density in the far-field region due to the dipole current is then formulated as:

$$|B_{far}| = \frac{\sigma_q A}{4\pi\varepsilon_o} \frac{L\omega^2}{c^3 R}, \quad (3)$$

where L is the dipole moment length, $\varepsilon_o$ is the permittivity of the free space, and c is the speed of light. The corresponding far-field electric field $|E_{far}|=c|B_{far}|$.

Figure 1C:
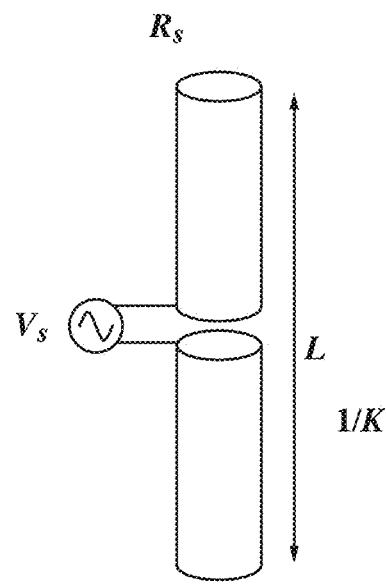
FIG. 1C is a generic electrically small antenna (ESA) representation of an infinitesimal dipole according to embodiments.
Figure 1D:
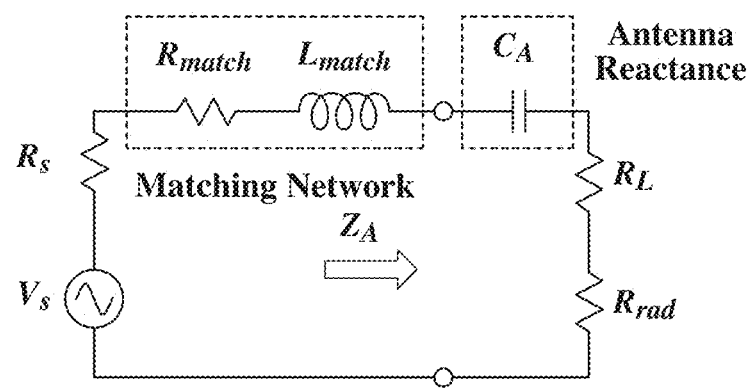
FIG. 1D is a schematic diagram of an ESA equivalent circuit model at low frequencies with a large antenna reactance dominating the antenna input impedance, which requires an impractical matching network according to various embodiments.

FIG. 1C is a generic electrically small antenna (ESA) representation of an infinitesimal dipole according to embodiments. FIG. 1D is a schematic diagram of an ESA equivalent circuit model at low frequencies with a large antenna reactance dominating the antenna input impedance, which requires an impractical matching network according to various embodiments. The low frequencies here may be considered as less than 1 MHz.

Figure 6:
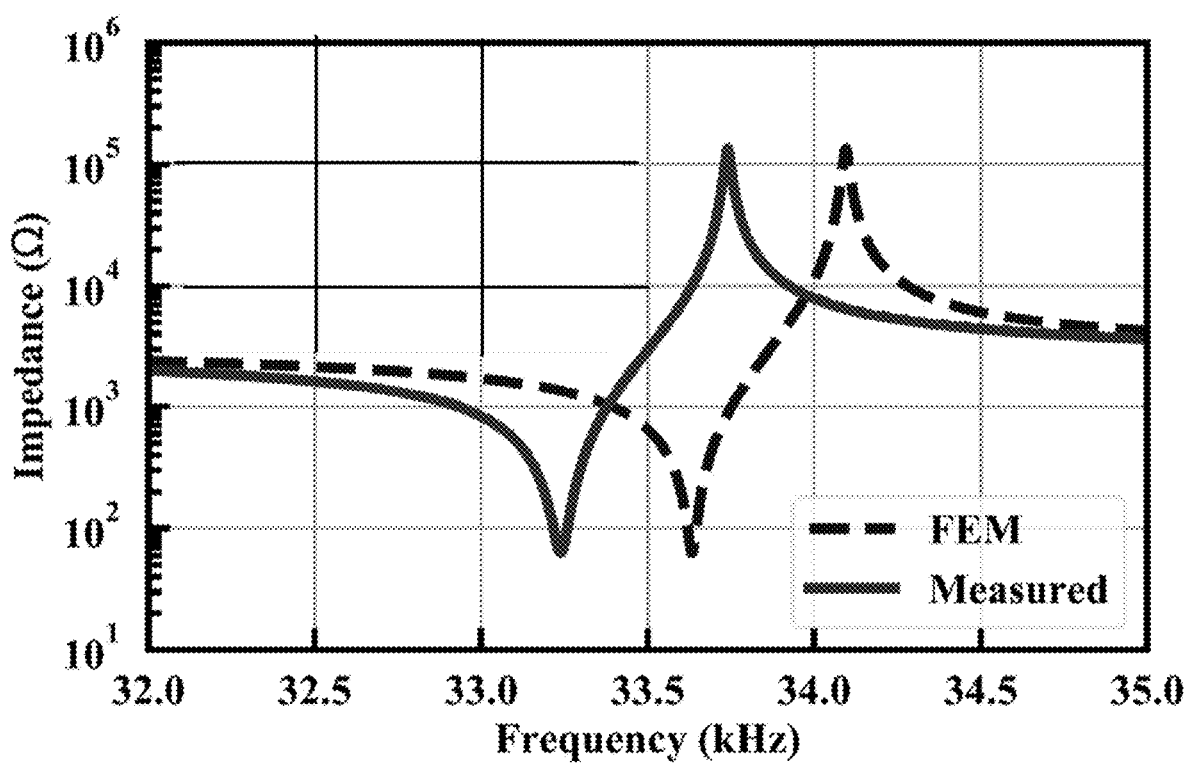
FIG. 6 is a graph illustrating simulated and measured impedances of the piezoelectric disc of FIG. 3A at input terminals of the piezoelectric antenna according to some embodiments.

For comparison, both the piezoelectric antenna and a generic electrically-small antenna (ESA), are shown in FIG. 1A and FIG. 1C, respectively. Both types of antennas can be modeled in the electrical domain with the equivalent circuit representations shown in FIG. 1B and FIG. 1D, respectively. The piezoelectric antenna is modeled with the Butterworth Van Dyke (BVD) model. The electrical equivalent circuit model for the disclosed piezoelectric antenna can be composed of a capacitor $C_o$, a transformer with turns ratio an inductor M a capacitor 1/k, and a resistor $B_m$ representing the static capacitance between the input terminals, electromechanical transformation ratio, mass, mechanical stiffness, and mechanical damping, respectively. Another resistor $B_{rad}$ is added to represent the losses due to EM radiation. This model can be further simplified by eliminating the transformer. In the simplified model, $R_m$ represents the mechanical losses, $B_{rad}$ represents the radiation losses, $\omega_r$ is the resonance frequency, $L_m$ is the motional inductance representing the mechanical mass effect, and $C_m$ is the motional capacitance representing the mechanical stiffness effect. At the mechanical resonance the reactive components cancel out ($\omega_r L_m = 1/\omega_r C_m$) and the input impedance of the piezoelectric antenna is $$R_m + R_{rad} << \frac{1}{\omega C_o},$$

where $R_{rad} << R_m$. The BVD circuit parameters can be calculated from the following equations:

$$R_m = \frac{\pi^2}{8\omega_r C_o k_t^2 Q}, \; L_m = \frac{\pi^2}{8\omega_r^2 C_o k_t^2}, \; C_m = \frac{8}{\pi^2} C_o k_t^2, \quad (4)$$

where $k_t^2$ is the electromechanical coupling coefficient and Q is the mechanical quality factor. The BVD parameters can be obtained by fitting the equivalent circuit response to the finite element modeling (FEM) result, as illustrated in FIG. 6 where the measurement, FEM, and parameters required to calculate circuit components are reported below in more detail. As previously explained, ESAs at low frequencies (less than 1 MHz) have a large reactive element that requires impractical matching compared with the disclosed piezoelectric antenna, which is designed to be impedance matched.

It can be shown that the radiation efficiency, defined as the radiated power divided by the input power, of the piezoelectric antenna is proportional to the piezoelectric material properties and dimensions. For radiation efficiencies much less than one, the radiation efficiency can be written as:

$$\xi_{ADMIRE} \propto d^2 C^E V Q \omega^3, \quad (5)$$

where V=LA is the volume of the piezoelectric material. The relative radiation efficiency for similarly sized piezoelectric antenna and ESA can be formulated as:

$$\xi_{rel} = \frac{\xi_{ADMIRE}}{\xi_{ESA}} \propto \frac{d^2 C^E Q \omega}{\sigma_c}, \tag{6}$$

where $\sigma_c$ is the electrical conductivity of the ESA metallic material. From Equation (6), the relative radiation efficiency of the piezoelectric antenna can be increased by selecting a material with larger stiffness, quality factor, and especially the piezoelectric strain constant due to its squared behavior. However, the main advantage of mechanical antennas arises from the mismatch efficiency of the piezoelectric antenna compared to ESAs at low frequencies below 1 MHz. The typical efficiency definition is the ratio of radiated power to the input power ($P_{rad}/P_{in}$). In this paper, we deviated from this definition to account for not only efficient radiation but also maximum radiated power. We define the matched antenna efficiency as the ratio of radiated power to the maximum power available for radiation from the source, which is achieved at conjugate matching for a lossless antenna.

While the piezoelectric antenna can be designed to have real resonant impedances that achieve high matching efficiency without the need for a matching network at low frequencies, ESAs are well known to exhibit small radiation resistances and large reactive components which result in an enormous mismatch efficiency (very low matched total antenna efficiency). To improve the matched antenna efficiency, ESAs require bulky impedance matching circuits to tune out the reactive component. The relative matched antenna efficiency of the piezoelectric antenna, normalized with respect to an impedance-matched ESA can be expressed as:

$$\zeta_{tot}^{rel} = \frac{\xi_{tot}^{ADMIRE}}{\xi_{tot}^{ESA}} = \frac{R_{rad}^{ADMIRE}}{R_{rad}^{ESA}} \frac{(R_{rad}^{ESA} + R_{loss} + R_{match} + R_s)^2}{(R_{rad}^{ADMIRE} + R_m + R_s)^2}, \tag{7}$$

where $R_{rad}^{ADMIRE}$ and $R_{rad}^{ESA}$ are the piezoelectric antenna (e.g., the ADMIRE) and the ESA radiation resistances respectively, $R_{loss}$ is the ESA conduction/dielectric losses, $R_{match}$ is the matching resistance resulting from the finite quality factor of the matching inductor, and $R_s$ is the source resistance as illustrated in FIGS. 1B-1D. Even with matching networks for the ESAs, typically consisting of low-frequency inductors with quality factors less than a few hundred, the matched impedance seen by the source remains in the kilo-ohms range, resulting in matched antenna efficiencies more than 6400 times greater in favor of piezoelectric antennas over ESAs.

In addition to the material properties essential for efficient radiation, the relative permittivity of the piezoelectric material bears significant consideration for reliable antenna operation. As the bound charge densities on the top and bottom surfaces of the piezoelectric material are flipped to induce the dipole current for radiation in Equation (2), an electric field E is produced. This electric field is inversely proportional to the relative permittivity as illustrated in Equation (8):

$$\frac{\sigma_q}{\varepsilon_r \varepsilon_o} \tag{8}$$

where $\varepsilon_r$ is the relative permittivity of the piezoelectric material. The radiated field strength for an antenna is determined by the maximum achievable current and its distribution. In the case of piezoelectric antennas, the maximum current limit is determined by the charge density that results in electric near-fields just below the breakdown limit of the surrounding environment, which is air in some cases. When electrical breakdown occurs, electrical charge can arc through the air and damage the piezoelectric material and electrodes of the piezoelectric antenna. Thus, the electrical breakdown of the surrounding material puts a maximum limit on the achievable charge density ($\sigma_q < \varepsilon_r \varepsilon_o E_{Breakdown}$) leading to a maximum limit on the radiated power. The total radiated power in watts can be derived via integrating the Poynting vector over a sphere in the far-field, which gives $P_{rad} = (\sigma_q A L \omega^2)^2 / 6\pi \varepsilon_o c^3$. Therefore, a high relative permittivity piezoelectric material can be used to maximize the radiated power without electrically breaking down the surrounding medium. The maximum radiated power that can be achieved will depend on material properties, as well as the antenna dimensions and operating frequency.

Figure 2A:
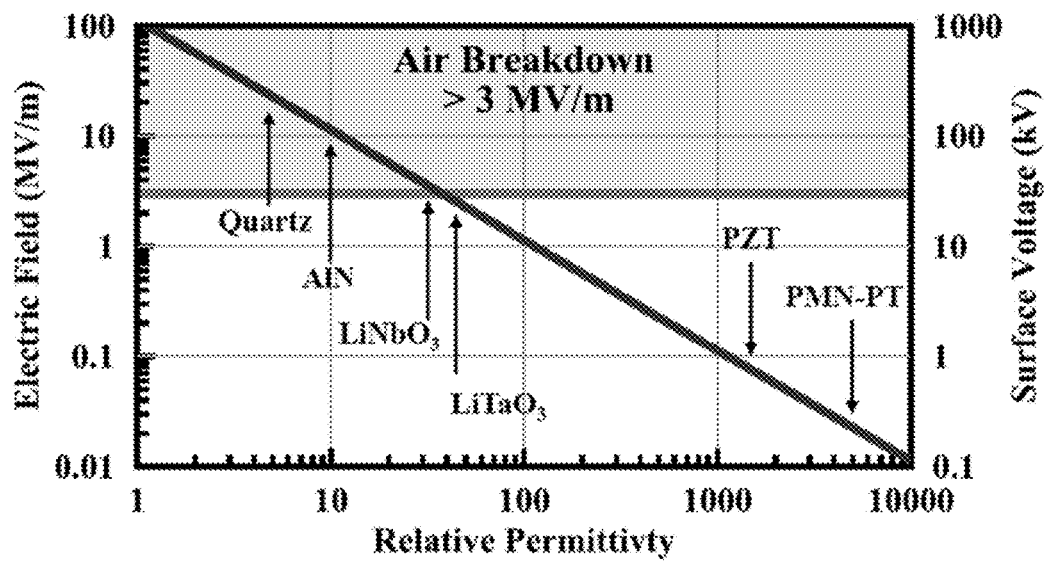
FIG. 2A is a graph illustrating a comparison of electric field and corresponding surface voltage as a function of the piezoelectric material permittivity for different piezoelectric materials according to some embodiments.

FIG. 2A is a graph illustrating a comparison of electric field and corresponding surface voltage as a function of the piezoelectric material permittivity for different piezoelectric materials according to some embodiments. A few commonly used piezoelectric materials, for which different values of relative permittivity are compared, include quartz, aluminum nitride (AlN), lithium niobate (LiNbO$_3$), lithium tantalate (LiTaO$_3$), zirconate titanate (PZT), and a magnesium niobate, lead titanate (PMN-PT), each with a larger relative permittivity. The same charge density of 1 millicoloumb per square meter (±1 mC/m$^2$) is assumed on the top and bottom surfaces while the generated electric field and the corresponding surface potential are calculated for a piezoelectric material with a thickness of 1 centimeter (cm). The top gray region is the air breakdown region where the electric field exceeds 3 megavolt (MV)/meter (m).

Figure 2B:
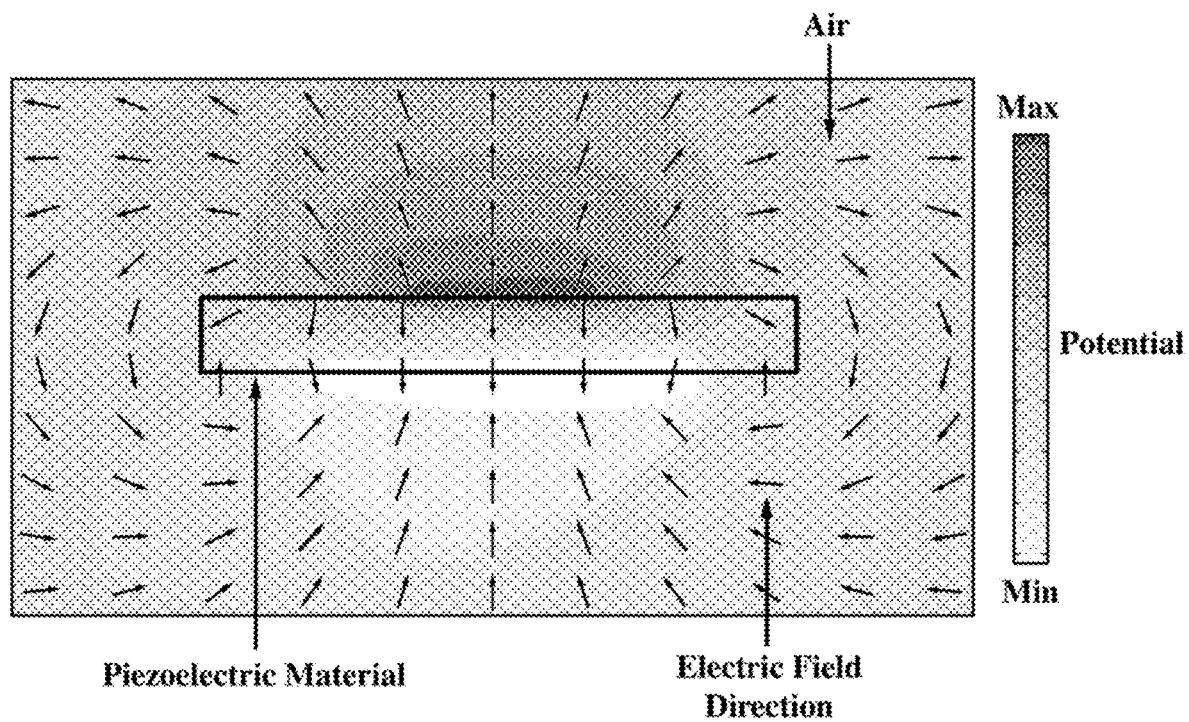
FIG. 2B is a graph illustrating a voltage distribution due to electric polarization and where the electric field direction is represented by arrows according to some embodiments.

FIG. 2B is a graph illustrating a voltage distribution due to electric polarization and where the electric field direction is represented by arrows according to some embodiments. In FIG. 2B, a piezoelectric material at resonance is surrounded by air and its corresponding voltage distribution are illustrated, where the fringing electric field is represented by the black arrows. For materials such as quartz, AlN, LiTaO$_3$, and LiNbO$_3$ with low/moderate relative permittivity, the electric field is higher than or very close to the air breakdown field (~3 MV/m), thus imposing a fundamental limit on the maximum radiation. Although one conceivable solution is non-metallic vacuum packaging, such packaging increases both the antenna volume and cost, making such an antenna bulky and less reliable. On the other hand, a piezoelectric antenna with a high relative permittivity such as PZT PMN-PT, with a relative permittivity greater than one thousand ($\varepsilon_r > 1000$), can be used to mitigate this issue. In addition to enabling greater maximum radiation, better near-field confinement inside high-permittivity piezoelectrics results in the near-field region becoming shortened to a fraction of the distance compared to the near-field of an equivalent infinitesimal electric dipole. To facilitate future material selection for optimal antenna performance, the following figure of merit for piezoelectric antennas is defined:

$$FoM = d^2 C^B \varepsilon_r Q. \tag{9}$$

Orders of magnitude further improvement in radiation efficiency for acoustically driven antennas is expected with further optimization of material choice and design.

Depending on design goals, different resonance modes and frequencies can be targeted based on the piezoelectric material properties, dimensions, vibration direction, and excitation to meet performance metrics. In this paper, a high FoM piezoelectric antenna is designed to operate at the upper bound of the VLF band. Emphasis is placed on measuring the piezoelectric antenna far-field radiation in the VLF band, and thus the FoM is constrained by frequency and geometry considerations and well below the ultimate FoM achievable for the piezoelectric antenna.

Figure 3A:
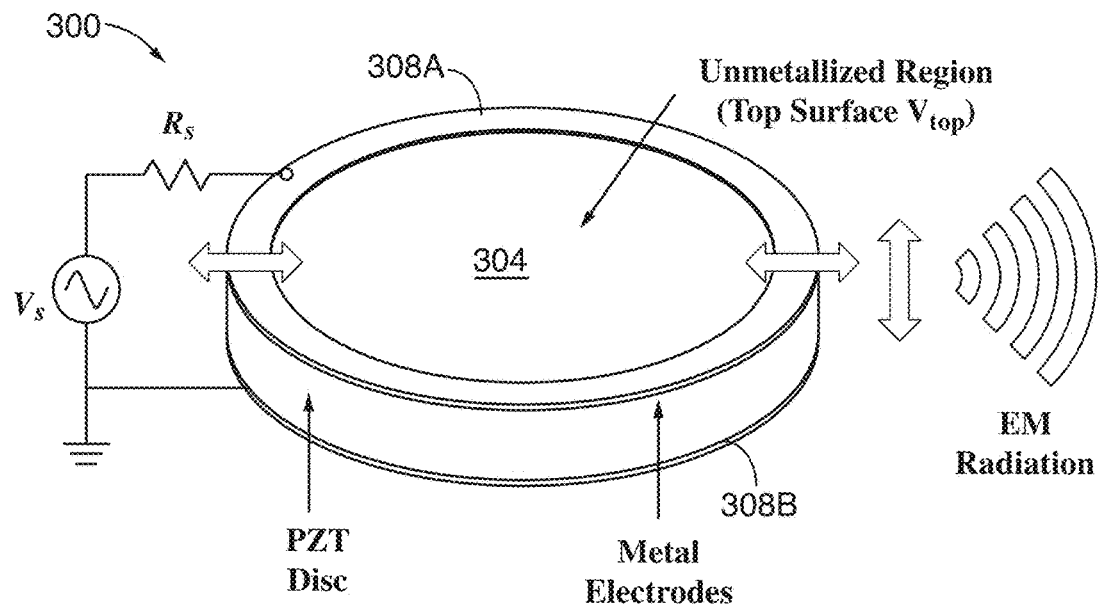
FIG. 3A is a schematic diagram illustrating a perspective view of an antenna employing a disc of a high-permittivity piezoelectric material as a radiating element according to some embodiments.
Figure 3B:
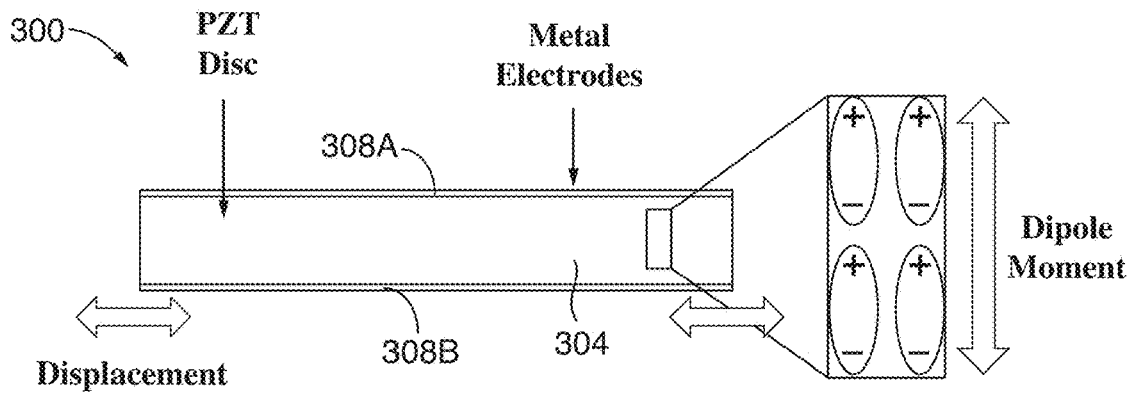
FIG. 3B is a schematic diagram illustrating a side view of the piezoelectric antenna of FIG. 3A according to some embodiments.

FIG. 3A is a schematic diagram illustrating a perspective view of a piezoelectric antenna 300 employing a disc 304 of a high-permittivity piezoelectric material as a radiating element according to some embodiments. FIG. 3B is a schematic diagram illustrating a side view of the piezoelectric antenna of FIG. 3A according to some embodiments. The piezoelectric radiating element can be a chunk of piezoelectric material. In some embodiments, including that illustrated in FIG. 3A, the chunk of piezoelectric material is a piezoelectric disc 304 (e.g., a disc resonator), although different geometries are envisioned for the chunk of piezoelectric material, including and not limited to, a disc, a slab, a cube, a rectangular box, a sphere, a cylinder, a half cylinder, or a combination thereof. The piezoelectric material can be a high-permittivity piezoelectric material such as PZT or PMN-PT, discussed with reference to FIGS. 2A-2B.

For the illustrated piezoelectric disc embodiment, the piezoelectric antenna 300 can further include a first electrode 308A disposed on (e.g., attached to) a first surface of the piezoelectric disc and a second electrode 308B disposed on (e.g., attached to) a second surface of the piezoelectric disc that is opposite to the first surface. In one embodiment, the first electrode 308A is attached along a circumference of the first surface of the piezoelectric disc 304 and the second electrode 308B is attached along a circumference of the second surface of the piezoelectric disc 304. In these embodiments, the first and second electrodes are made of metal, such as, for example, from aluminum (Al), copper (Cu), titanium (Ti), silver (Ag), or gold (Au). Other metals are envisioned. In various embodiments, the first and second electrodes are to be relatively thin, e.g., be sized to be between 0.25 cm and 0.75 cm wide and between 10 microns (μm) and 30 μm thick. In one embodiment, the first and second electrodes 308A and 308B are each about 0.5 cm wide and 20 μm thick.

Thus, as illustrated, the first electrode 308A and the second electrode 308B can be circular to conform to the shape of the piezoelectric disc 304. In alternative embodiments, a pair of electrodes can be sized to attach to perimeter boundaries of different shapes (such as the geometries listed above) of the chunk of piezoelectric material from which is formed the piezoelectric antenna 300. For example, the first electrode 308A can be attached along an outer perimeter of the first surface of the chunk of piezoelectric material and the second electrode 308B can be attached along an outer perimeter of the second surface of the chunk of piezoelectric material. Each of the first electrode and the second electrode in these embodiments can be located across the chunk of piezoelectric material from each other and be excited by a time-varying (e.g., sinusoidal) voltage signal that can be modulated with a bit stream of data.

In illustrated embodiments, the first electrode 308A and the second electrode 308B are to receive the time-varying voltage to excite a mechanical vibration in the piezoelectric disc, e.g., from a voltage source (Vs) that has a source resistance (Rs). The applied time-varying voltage causes the piezoelectric disc 304 to radiate electromagnetic energy at a particular frequency responsive to the mechanical vibration. Because the particular frequency of radiation is proportional to the size of the piezoelectric disc 304, which will be discussed in more detail, the piezoelectric disc 304 can be designed to impart a corresponding frequency. For example, the piezoelectric disc 304 can be sized with a diameter (D) of between 13.4 cm and 6.7 cm in order to radiate at between 20 kHz and 40 kHz, respectively. Further, in some embodiments, a thickness (T) of the piezoelectric disc 304 is between 0.5 cm and 1.5 cm. In one embodiment, the piezoelectric disc 304 has a diameter of 8 cm, a thickness of 1 cm, and radiates at about 33.6 kHz.

In various embodiments, the structure of the piezoelectric antenna 300 forms an acoustic resonator that is mechanically free with metal electrodes to drive the piezoelectric disc 304 into resonance via the $d_{31}$ coefficient of the material property of PZT (e.g., coming from a $d_{ij}$ value that is the piezoelectric coefficient). The lateral vibration of the piezoelectric disc 304, also known as contour mode or dilation mode, is excited by applying a time-varying voltage on the metalized edges of the piezoelectric disc 304. Upon excitation, the time-varying electric field introduced by the first and second electrodes 308A and 308B excites the piezoelectric disc 304 into vibration via the inverse piezoelectric effect. The excited acoustic wave is reflected by the piezoelectric disc boundaries, resulting in a standing acoustic wave with its maximum stress at the disc center.

Figure 3C:
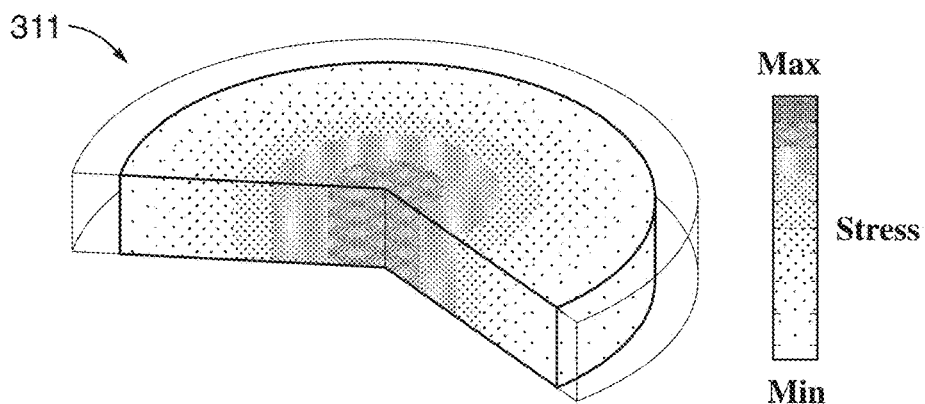
FIG. 3C is a graph illustrating a radial stress distribution at resonance formed by an acoustic standing wave, under an applied voltage, through the piezoelectric disc of FIG. 3A according to some embodiments.

FIG. 3C is a graph illustrating a radial stress distribution 311 at resonance formed by an acoustic standing wave, under an applied voltage, through the piezoelectric disc 304 of FIG. 3A according to some embodiments. The radial stress distribution 311 was simulated with COMSOL Multiphysics v4.4. FIG. 3C illustrates the resonance dilation mode at 33.6 kHz along with the stress distribution for purposes of explanation according to just one embodiment. During vibration, the mechanical stress on the piezoelectric disc 304 generates electrical charges via the direct piezoelectric effect. The charges generated in the metalized electrode areas are neutralized by the first and second electrodes, so the electrodes are designed around the edge of the disc where stress is lowest, leaving the highest stress, highest charge density center of the disc free to radiate. The density of the electrical charge is amplified by the quality factor at resonance, leading to a large time-varying dipole moment (current) that causes EM radiation. Additional geometries can be used to excite different high coupling piezoelectric materials in optimal resonant modes (such as dilation, thickness extensional or shear) to maximize generated charge, and thus radiation, due to higher piezoelectric coupling coefficients. As discussed, these additional geometries can include a disc, a slab, a cube, a rectangular box, a sphere, a cylinder, a half cylinder, and the like.

Figure 4:
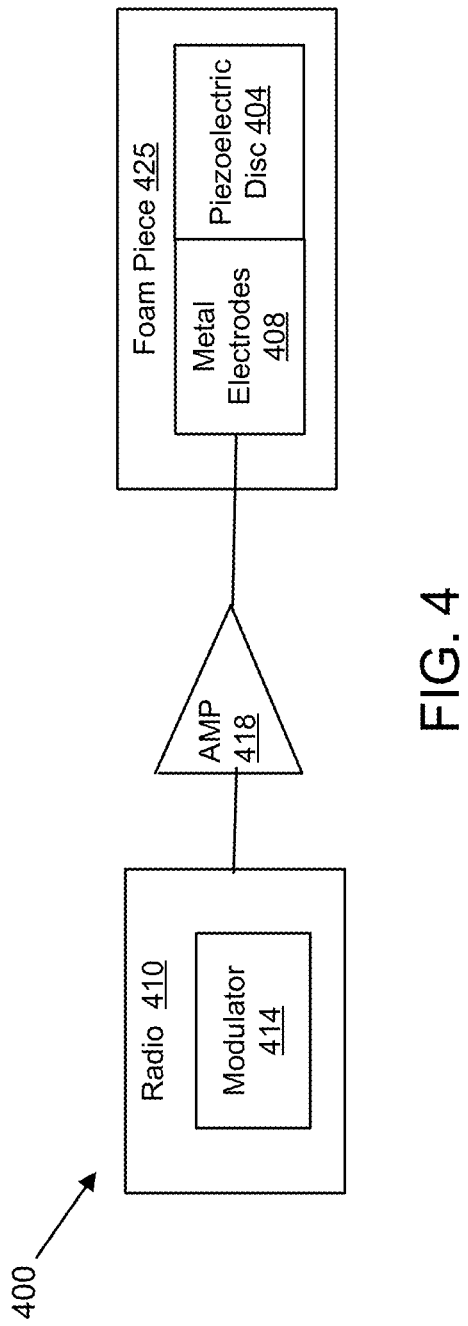
FIG. 4 is a schematic block diagram of an apparatus for radiating electromagnetic signals in a low frequency range using a piezoelectric antenna according to an embodiment.

FIG. 4 is a schematic block diagram of an apparatus 400 for radiating electromagnetic signals in a low frequency range using a piezoelectric antenna according to an embodiment. The apparatus, for example, includes a radio 410 having a modulator 414, the radio 410 being coupled to an amplifier 418. In one embodiment, the amplifier 418 is included in the radio 410. The amplifier 418 is coupled to a piezoelectric antenna, e.g., across a pair of metal electrodes 408 that are attached to a piezoelectric disc 404. In some embodiments, the pair of metal electrodes 408 and the piezoelectric disc 404 are the first and second electrodes 308A and 308B and the piezoelectric disc of 304 of FIG. 3A.

In one embodiment, the radio 410 (which can include the amplifier 418) is an integrated circuit chip or is disposed on a printed circuit board. In another embodiment, the radio 410 is an analog radio optionally including some integrated circuit components.

In various embodiments, the radio 410 imparts a time-varying voltage signal to excite a mechanical vibration in the piezoelectric disc 304 that causes the piezoelectric disc to radiate an electromagnetic signal at a particular carrier frequency. For example, the carrier frequency can be between 20 kHz and 40 kHz, or near this range. In one embodiment, the apparatus further includes a foam piece 425. In these embodiments, the piezoelectric disc 304 is one of resting on or encased within the foam piece 425. The foam piece 425 may enable the piezoelectric disc 404 to be mechanically free to resonate at the particular frequency at which the piezoelectric disc 404 is designed to radiate an electromagnetic signal. The foam piece 425 can be made of different foam materials, such as polyethylene foam, cross-linked polyethylene foam, polyurethane foam, reticulated polyurethane foam, melamine foam, ethafoam, volara, different types of sponge materials, and the like materials soft enough to facilitate mechanically-free resonance of the chunk of piezoelectric material.

In some embodiments, the modulator 414 is adapted to modulate a bit stream of data onto the electromagnetic signal, where the amplifier 418 can be coupled between the radio 410 and the first and second electrodes, the amplifier 418 to amplify a modulated time-varying voltage signal received from the radio. This modulated time-varying voltage signal can be what drives the piezoelectric disc into resonance. More specifically, in addition to efficient radiation, passband transmission involves a modulation technique to send information, e.g., as a bit stream modulated onto the electromagnetic signal.

In various embodiments, the modulator 414 employs simple and common digital modulation schemes such as binary amplitude, frequency, and phase-shift keying to directly modulate the piezoelectric antenna (carrier) amplitude, frequency or phase with a modulating bit stream. For example, the digital modulation schemes can include binary amplitude-shift keying (BASK), binary frequency-shift keying (BFSK), or binary phase-shift keying (BPSK), for example. A mechanical antenna such as the disclosed piezoelectric antenna has a settling time that is directly proportional to its quality factor and limits the BASK (on-off keying) rate since the mechanical system is switched on and off corresponding to bit 1 and bit 0, respectively. The same applies to BPSK due to the phase discontinuity that requires the system to resettle and synchronize with the driving signal every time the phase changes. This presents a tradeoff between the material quality factor (Q), which enables efficient antenna radiation, and the maximum achievable data rate, which enables bandwidth efficiency. On the other hand, BFSK can be designed to have a fixed amplitude and continuous phase, sometimes referred to as continuous-phase FSK (CPFSK), or minimum-shift keying (MSK), which mitigates the amplitude settling limitation but still has the same tradeoff as the bit rate in the case of BFSK being limited by frequency settling (different from amplitude settling).

An FoM presenting the characteristics of a BFSK modulator can be expressed as follows:

$$FoM_{Mod} = \Delta f \times FSK_{Rate}, \quad (10)$$

where $\Delta f$ is the separation between the two frequencies representing the binary message ($\Delta f = f_2 - f_1$) and $FSK_{Rate}$ is the maximum achievable FSK rate for switching between the two frequencies. For practical systems, $\Delta f$ can be designed as large as possible to allow for larger separation between the band-pass filters (BPF) in the receiver, which relaxes the BPF design specifications and reduces the bit error rate (BER), while higher $FSK_{Rate}$ enables higher bit rates (for BFSK $Bit_{Rate} = 2 \times FSK_{Rate}$).

Figure 5:
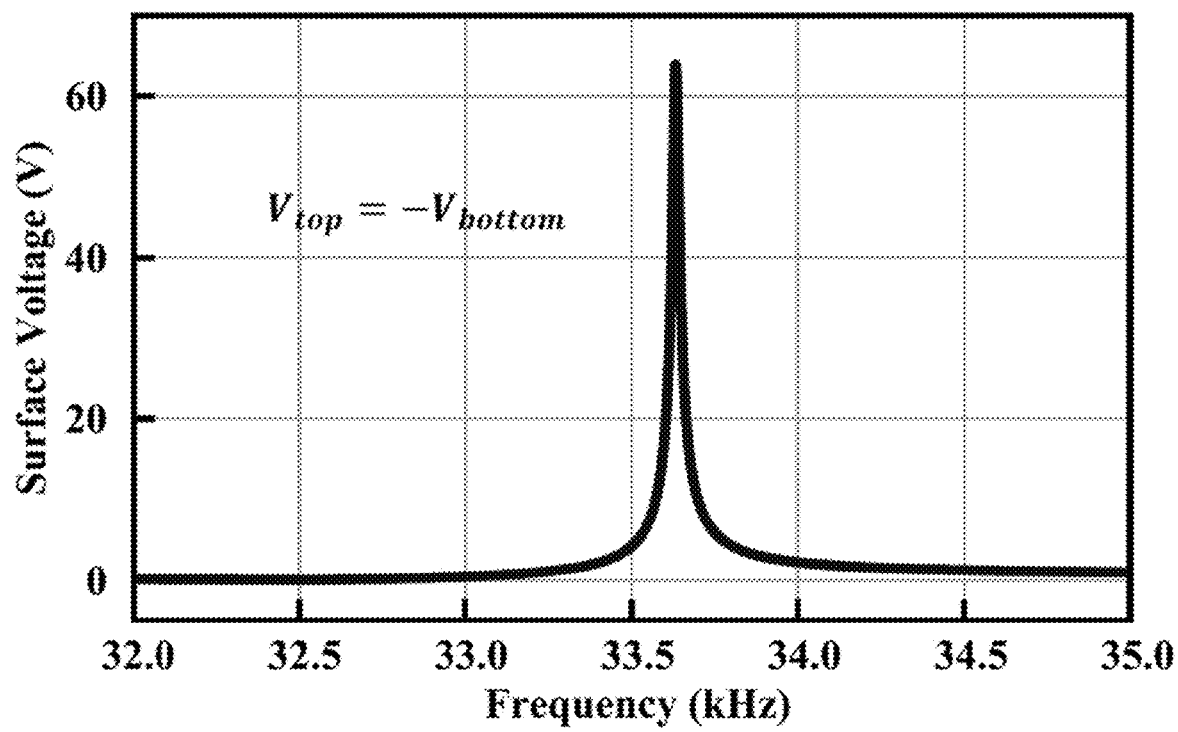
FIG. 5 is a graph illustrating a simulated surface voltage of the piezoelectric disc of FIG. 3A with an applied voltage according to some embodiments.

FIG. 5 is a graph illustrating a simulated surface voltage of the piezoelectric disc 304 of FIG. 3A with an applied voltage according to some embodiments. The simulated average surface voltage was over the entire unmetallized region of the piezoelectric disc 304 with an applied voltage amplitude of one volt (1 V).

FIG. 6 is a graph illustrating simulated and measured impedances of the piezoelectric disc 304 of FIG. 3A at input terminals of the piezoelectric antenna 300 according to some embodiments. As can be observed, the measured and simulated closely match and are offset slightly in frequency. A motional resistance of 63Ω is designed to match with typical 50Ω systems at the 33.6 kHz resonance, as seen in FIG. 6, which illustrates the impedance at the input terminals of the piezoelectric disc 304 (both simulated and measured). Because $R_{rad}$ is negligible for matching consideration ($R_{rad} \ll R_m$), the motional resistance can be further tailored for perfect matching with 50 CI systems by changing the width of the electrodes to modify $C_0$. According to the BVD model, $R_m$ can be expressed as shown in Equation (4).

Figure 7:
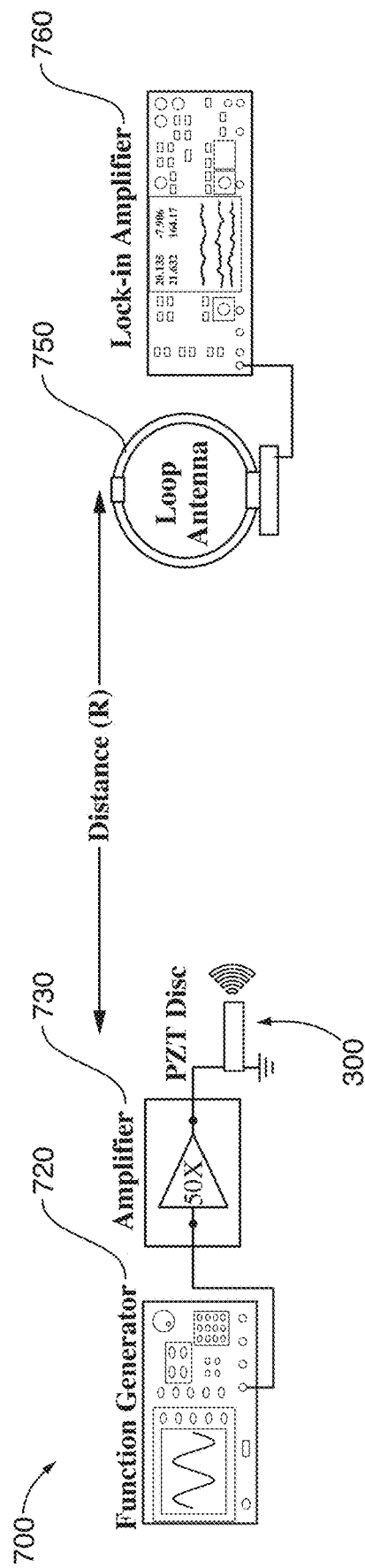
FIG. 7 is a schematic diagram illustrating a measurement setup for detecting a magnetic field radiation from the piezoelectric antenna according to some embodiments.

FIG. 7 is a schematic diagram illustrating a measurement setup 700 for detecting a magnetic field radiation from the piezoelectric antenna 300 according to some embodiments. In one embodiment, the measurement setup 700 includes a function generator 720, an amplifier 730, the piezoelectric antenna 300, a loop antenna 750, and a lock-in amplifier 760. The function generator 720 can be coupled to the amplifier 730, which is coupled to the piezoelectric antenna 300 that radiates an electromagnetic signal in response to a time-varying voltage being excited through the piezoelectric disc 304 (FIG. 3A). The lock-in amplifier 760 can detect the electromagnetic signal received by the loop antenna 750 across a distance (R).

Figure 8:
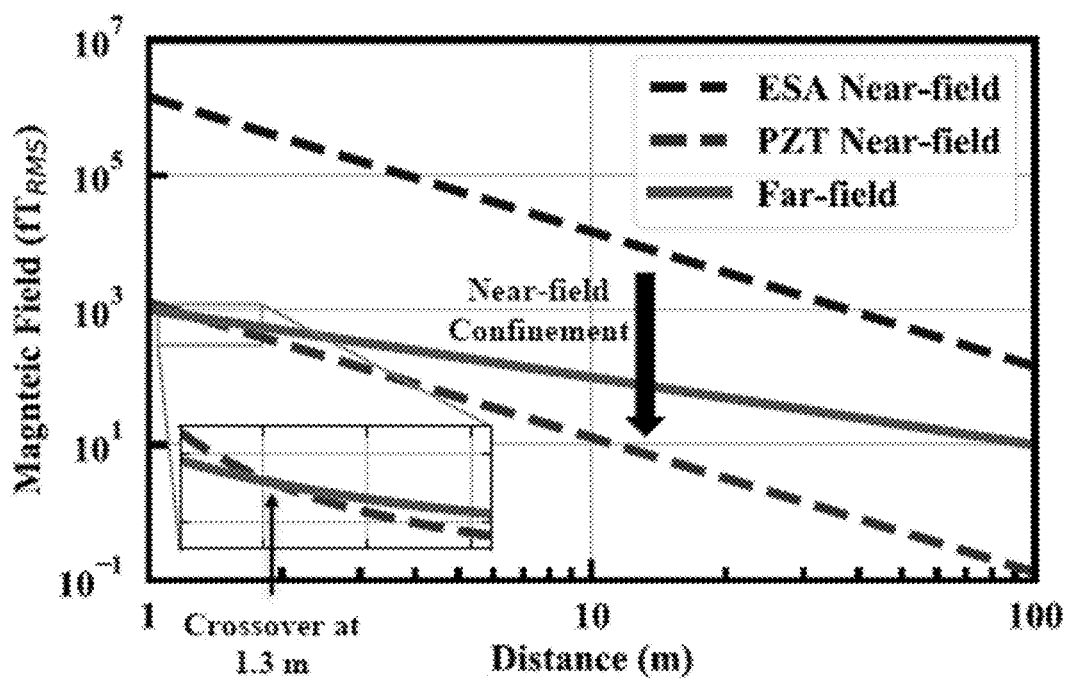
FIG. 8 is a graph illustrating simulation results comparing ESA (infinitesimal dipole) and piezoelectric magnetic fields according to some embodiments.
Figure 9:
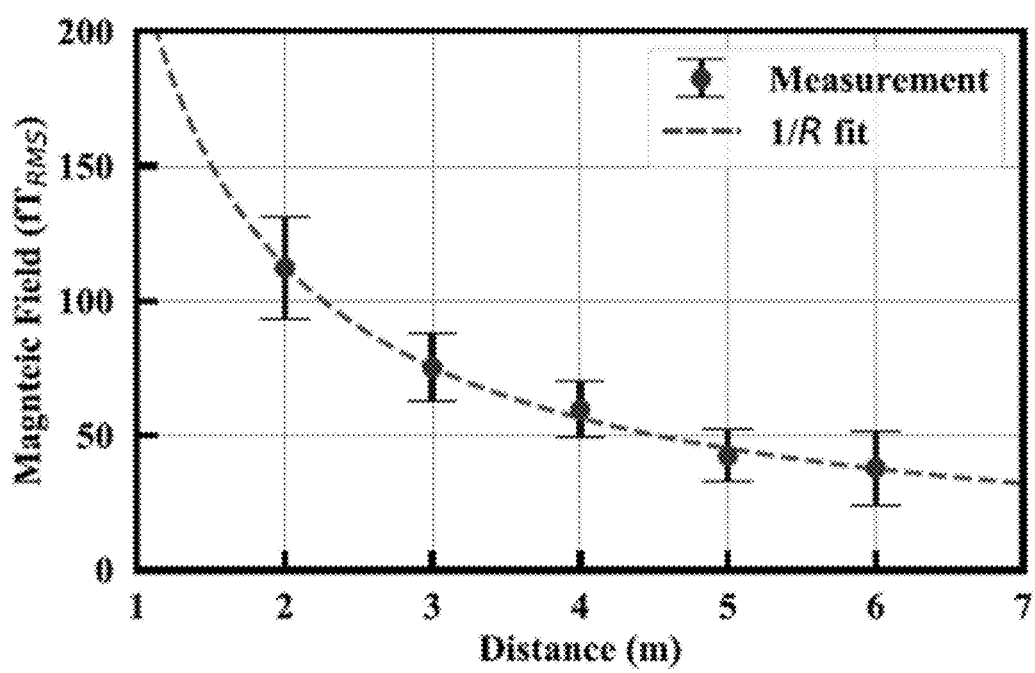
FIG. 9 is a graph illustrating a magnetic field as a function of distance exhibiting far-field polarization from the piezoelectric antenna according to some embodiments.

FIG. 8 is a graph illustrating simulation results comparing ESA (infinitesimal dipole) and piezoelectric magnetic fields according to some embodiments. Due to the high relative permittivity of PZT (or other high-permittivity piezoelectric materials), the magnetic field is confined within piezoelectric materials, which dramatically reduces the near-field component relative to the equivalent ESA approximation. The radiated far-field can be measured very close to PZT after passing the crossover point at 1.3 m. FIG. 9 is a graph illustrating a magnetic field as a function of distance exhibiting far-field polarization from the piezoelectric antenna 300 according to some embodiments.

To demonstrate the piezoelectric antennas, a prototype is created from a 1 cm thick, 8 cm diameter disc of PZT. A 20 μm thick, 0.5 cm wide silver ring electrode is patterned onto the top and bottom surfaces and driven to excite the PZT disc in the dilation mode via the $d_{31}$ piezoelectric coefficient. The resonant response is extracted from a direct impedance measurement and yields the results shown in FIG. 6.

In various embodiments, the radiation measurements of the piezoelectric antenna 300 are complicated by the near-field confinement due to the high permittivity of the PZT. Unlike the far-field radiation of the piezoelectric antenna 300, which is dependent only on the equivalent current caused by the flipping dipole moments, the radiated near-fields are confined by the large relative permittivity of PZT within the dielectric. This means that near-field radiation, characterized by $1/R^3$ for electric fields and $1/R^2$ for magnetic fields, is diminished in both magnitude and distance. Compared to an equivalently sized 33 kHz ESA which radiates in the near-field regime up to 1 km, the piezoelectric antenna 300 reaches its far-field regime (magnetic) after around 1.3 m. Due to the respective distance scaling of $1/R^2$ vs. $1/R$, equivalent magnetic field radiation from the ESA is 100 times larger at ten meters than the piezoelectric antenna 300 radiating the same power. Therefore, both the PZT disc and the measurement setup shown in FIG. 7 are designed to minimize RF interference from the leads and connections so that the PZT radiation is not obscured.

In some embodiments, the magnetic field versus distance is measured in free space to minimize radio frequency interference (RFI) and scattering using the setup 700 shown in FIG. 7. As seen in FIG. 9, the measured magnetic field decreases as $1/R$ as expected from the simulations in FIG. 8, confirming the PZT-based piezoelectric antenna 300 exhibits far-field radiation in close proximity to the piezoelectric antenna 300. An input power of 1.2 W is supplied to excite the PZT disc. Radiation is measured using the passive loop antenna 750 and the magnetic field is extracted from measurement of the lock-in amplifier 760 using the measured antenna factor $AF=B_{RMS}/\mu_0 V_{RMS}$, where $B_{RMS}$ is the root mean square (RMS) magnetic field, $V_{RMS}$ is the voltage measured with the lock-in amplifier 760, and $\mu_0$ is the free space permeability. In order to better distinguish the measured radiation from noise, an average field reading is collected over two minutes at each distance. Extrapolating the measured data to 1 km yields a magnetic field of 0.23 $fT_{RMS}$ with a driving power of 1.2 W compared to a simulated magnetic field of 0.5 $fT_{RMS}$ The discrepancy between the simulated and measured field strengths is likely due to imperfect earth ground effects, shifts in resonance due to ambient temperature changes, and effects from nearby radiators and reflectors.

Figure 10:
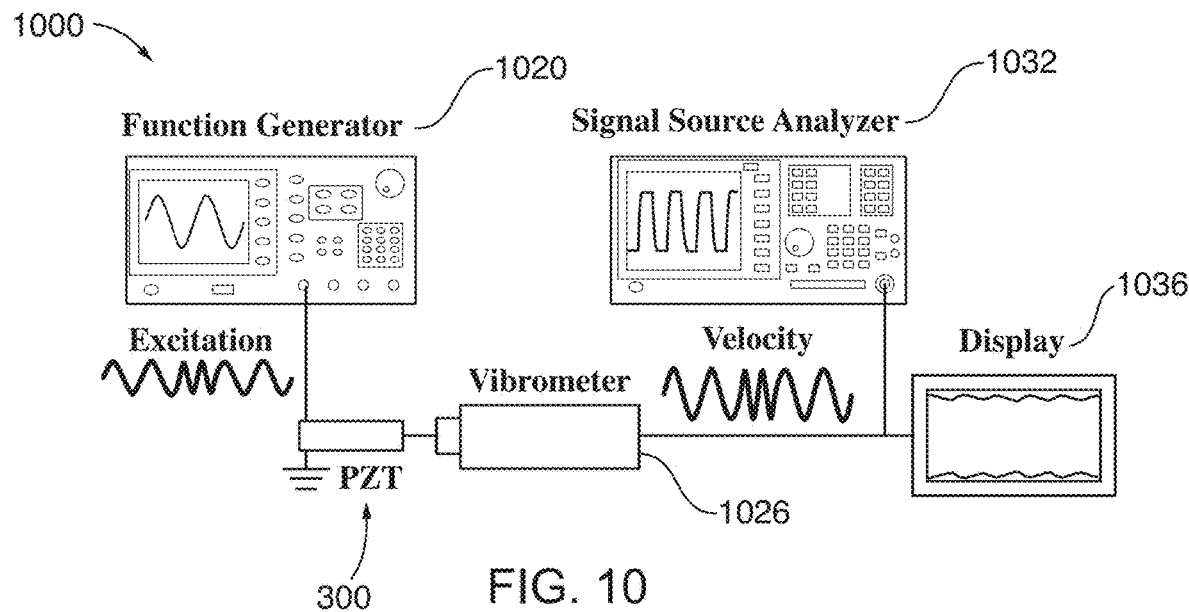
FIG. 10 is a schematic diagram of a measurement setup used to measure acoustically-vibrated electromagnetic signals that were also modulated with a bit stream according to some embodiments.
Figure 11:
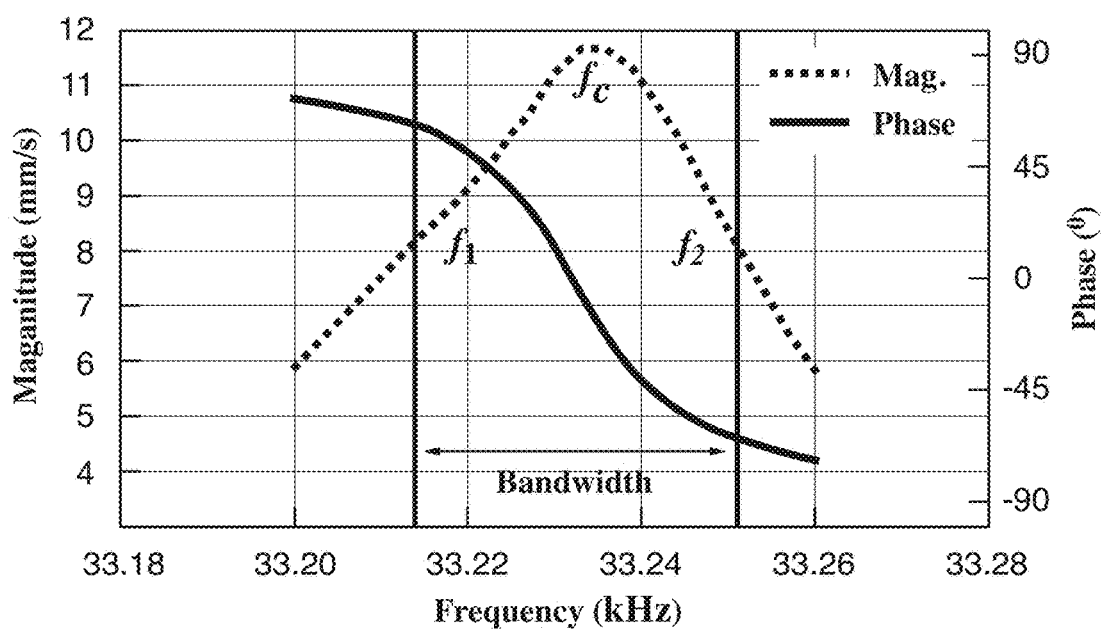
FIG. 11 is a graph illustrating a frequency response of the velocity (both magnitude and phase) at an edge of the piezoelectric disc measured by the measurement setup of FIG. 10 according to embodiments.
Figure 12:
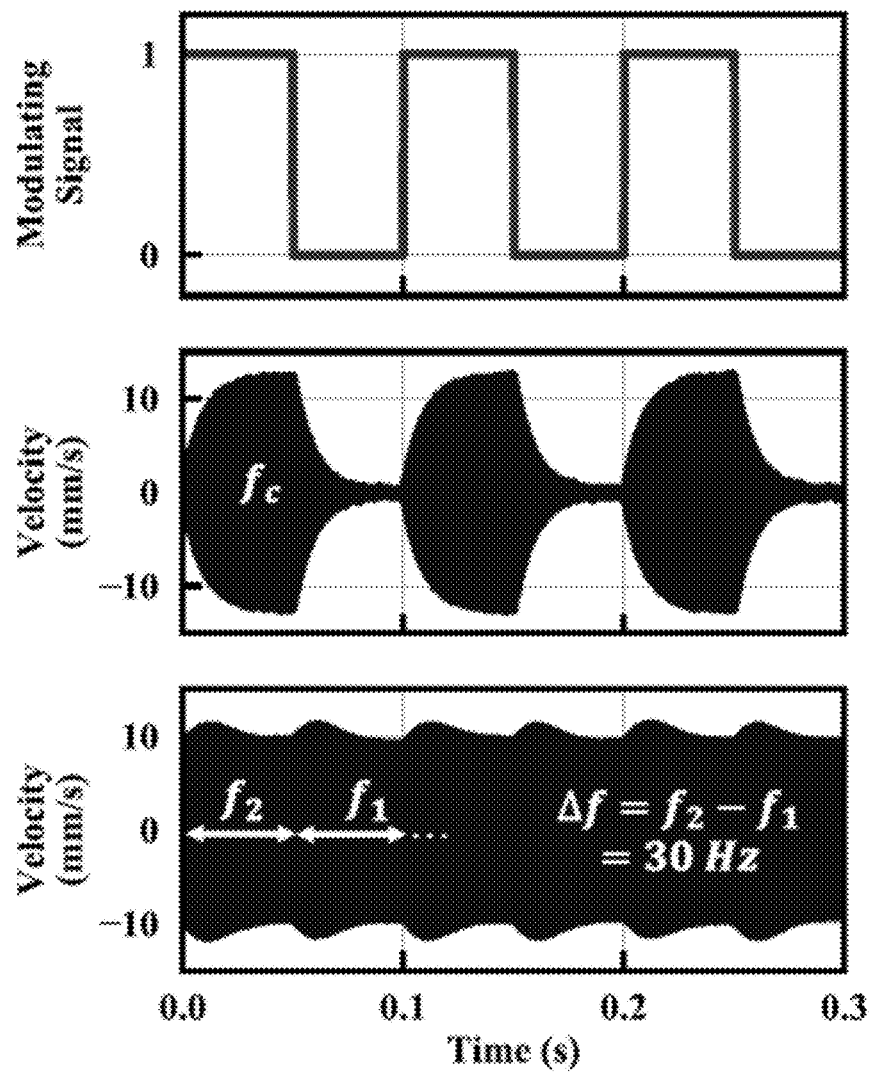
FIG. 12 is a series of corresponding graphs illustrating (from top to bottom) a 10 Hz bit stream, a vibrometer velocity measurement of the amplitude-shift keyed (ASK) signal, and a vibrometer velocity measurement of the frequency-shift keyed (FSK) signal received from the piezoelectric antenna in the measurement setup 1000 of FIG. 10 according to some embodiments.

FIG. 10 is a schematic diagram of a measurement setup 1000 used to measure acoustically-vibrated electromagnetic signals that were also modulated with a bit stream according to some embodiments. The measurement setup 1000 includes a function generator 1020 used to excite the piezoelectric disc 304 of the piezoelectric antenna 300, an optical vibrometer 1026 to detect an amount of vibration of the piezoelectric disc 304, and a signal source analyzer 1032 and signal source analyzer 1032 and display 1036 coupled to each other and to the vibrometer 1026. FIG. 11 is a graph illustrating a frequency response of the velocity (both magnitude and phase) at an edge of the piezoelectric disc measured by the measurement setup 1000 of FIG. 10 according to embodiments. FIG. 12 is a series of corresponding graphs illustrating (from top to bottom) a 10 Hz bit stream, a vibrometer velocity measurement of the amplitude-shift keyed (ASK) signal, and a vibrometer velocity measurement of the frequency-shift keyed (FSK) signal received from the piezoelectric antenna in the measurement setup 1000 of FIG. 10 according to some embodiments.

In various embodiments, the piezoelectric disc 304 is directly modulated using the function generator 1020, which outputs both ASK and FSK signals with the resonant response of the piezoelectric disc 304 captured using the optical vibrometer 1026. In both cases, a 10 Hz binary bit stream at the top of FIG. 12 is used. With the ASK signal, as the driving signal is switched on and off, the resonator energy ramps up and down over a duration inversely proportional to the loaded quality factor ($Q_L=850$). The ramping time limits the fundamental modulation rate for direct BASK to approximately ½T, where the time constant $T=3\times(2Q_L/\omega) \approx 24.4$ ms (corresponding to 95% settling from the peak value) for the demonstrated measurement. A fundamental design tradeoff is considered to balance the inversely proportional data rate with the high Q desired for the radiation FoM. BFSK modulation is conducted within the 3-dB bandwidth of the PZT resonator (e.g., the piezoelectric disc 300) corresponding to BFSK frequencies of $f_1=33.218$ kHz and $f_2=33.248$ kHz. The input is a continuous-phase FSK with no discontinuity when switching between the two frequencies. However, due to the phase difference of the mechanical resonator at the two frequencies, the mechanical resonance is out of phase with the modulated driving signal when it is switched and ramping of the PZT edge velocity occurs while energy is transferred from one resonant frequency to another as seen in FIG. 12 (bottom).

FIG. 13A is a series of corresponding graphs illustrating (from top to bottom) a modulating signal, a measured velocity, and a demodulated signal of a measured FSK data rate of 5 Hz based on an electromagnetic signal received from the piezoelectric antenna 300 using the signal source analyzer (SSA) 1032 (FIG. 10) according to some embodiments.

FIG. 13B is a series of corresponding graphs illustrating (from top to bottom) a modulating signal, a measured velocity, and a demodulated signal of a measured FSK data rate of 20 Hz based on an electromagnetic signal received from the piezoelectric antenna using the SSA 1032 (FIG. 10) according to some embodiments. As the modulation frequency approaches the limit set by the frequency settling, although the amplitude of resonance is not diminished, the demodulated output signal is distorted as seen in FIGS. 13A-13B (middle). Multiple approaches can be implemented to surpass the Q-limited fundamental modulation rate of the resonator by ensuring that the phase of the resonator and driving signal are in phase during modulation transitions.

Figure 14:
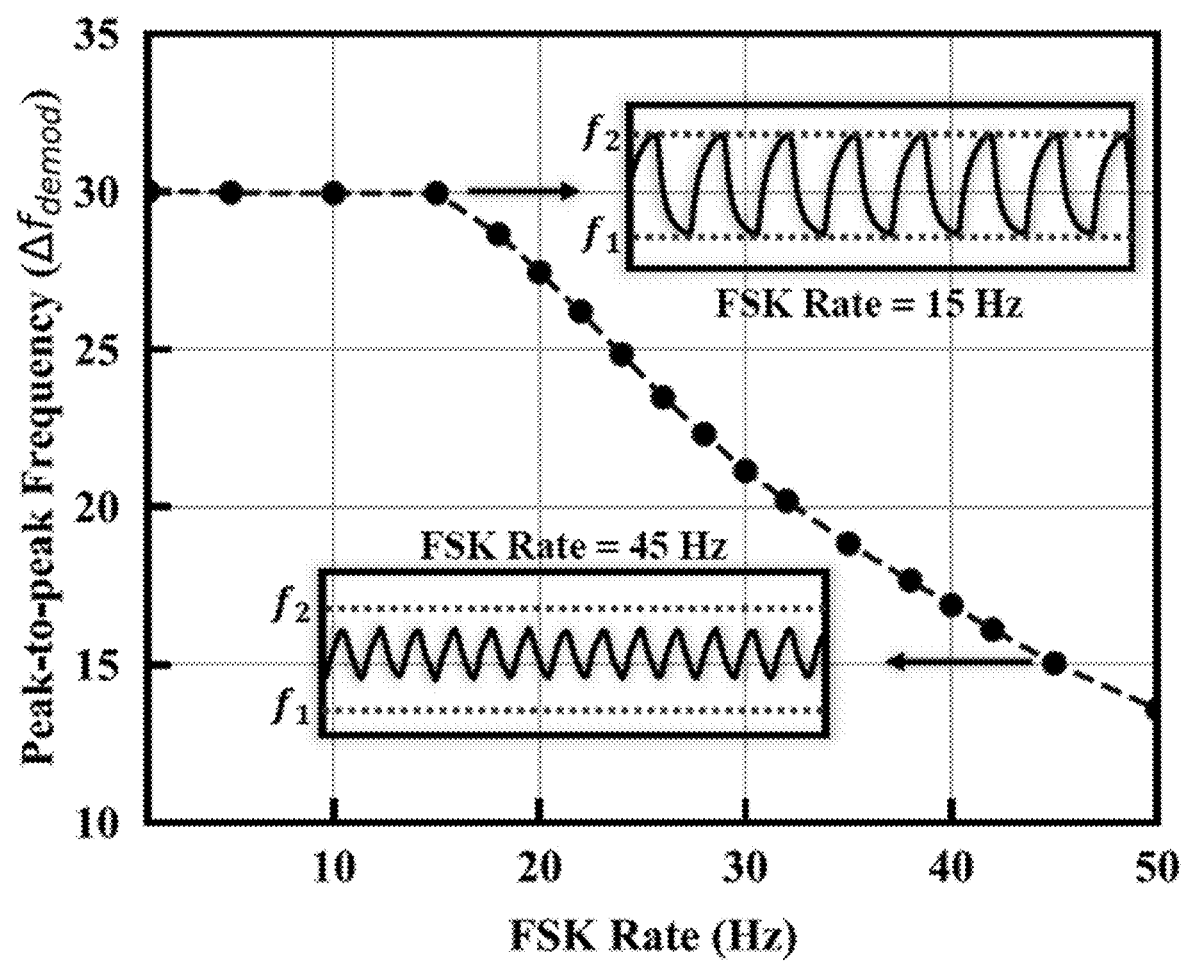
FIG. 14 is a graph that illustrates a peak-to-peak frequency difference (e.g., $\Delta f_{demod} = f_2 - f_1$) after demodulation of the received electromagnetic signals with the SSA at different FSK rates according to some embodiments.

FIG. 14 is a graph that illustrates a peak-to-peak frequency difference (e.g., $\Delta f_{demod}=f_2-f_1$) after demodulation of the received electromagnetic signals with the SSA 1032 (FIG. 10) at different FSK rates according to some embodiments. The upper limit for direct modulation using the 3 dB bandwidth is limited by frequency settling, the maximum direct modulation frequency is approached resulting in a distorted modulation waveform.

Despite the demand for portable VLF communication for long-range, low power applications with modest bandwidth requirements, electrical antennas have proven untenable at VLF frequencies due to the inherently poor tradeoff between electrical size and efficiency. Acoustic antennas operating at wavelengths up to five orders of magnitude less than EM wavelengths have been considered as alternatives to overcome the inefficiency of sub-resonance operating sizes. However, until recently, piezoelectric materials have been insufficient to meet demands for handheld EM communication. As shown in Equation (5), efficient radiation requires both large electromechanical coupling coefficients and a high mechanical quality factor, which is difficult to achieve since most piezoelectric materials empirically exhibit an inverse relationship between these parameters. Moreover, the relative permittivity of the piezoelectric material must be as high as possible in order to relax the electrical breakdown limit of the surrounding medium and maximize the radiated power. Additionally, even if desirable piezoelectric material properties can be achieved, fabricating the piezoelectric geometry and orientation to achieve the desired fundamental acoustic resonance mode can prove difficult due to poling and material growth considerations.

Herein, a proof of concept VLF mechanical antenna, made of commercially available materials, devoid of any special packaging schemes, and surpassing the matched efficiency of ESAs by three orders of magnitude, is presented to lay a foundation for further enhancement. A bulk PZT disc, which provides the best tradeoff between electromechanical coupling coefficients, mechanical quality factor, relative permittivity, and availability is demonstrated as representative of high-permittivity piezoelectric materials usable in the chunk of piezoelectric material, which can be employed within the piezoelectric antenna 300. The PZT dimensions are tailored to yield a fundamental acoustic resonance near the edge of the VLF range at 33 kHz, as illustrated in FIG. 6. In various embodiments, exciting the fundamental mode to align all the dipole moments inside the material in the same direction provides for maximum radiation as higher-order modes will have dipole moments aligned to opposite directions and partially cancel the EM radiation.

Unlike most electrical antennas where the far-field regime of VLF antennas occurs kilometers away from the source, far-field radiation from the piezoelectric antenna 300 can be measured as close as two meters. Typically, at distances less than a wavelength away from an antenna, the near-field reactive energy component is much larger than the far-field radiated energy. Since the reactive fields decay ($1/R^2$) much faster with distance than the radiated fields ($1/R$), at some distance approximately one wavelength from the antenna the radiated field becomes larger than the reactive near fields. However, the high relative permittivity of the PZT (~1000 or higher) confines most of the reactive energy inside of the piezoelectric disc 304, greatly reducing the cross-over point where the radiated fields become dominant and allowing the radiated far-field to be directly measured at distances as close as two meters. Although such a close far-field region is unconventional for VLF electrical antennas, the phenomena theoretically predicted by the FEM simulations shown FIG. 8 was experimentally verified as illustrated in FIG. 9 where the measured magnetic field decays at a rate of 1/R.

As the reactive fields are normally much larger than the radiated fields near the antenna, the reduction of the reactive fields due to confinement inside of the piezoelectric material limits the currently achievable communication distance of the piezoelectric antenna 300 prototype (e.g., ADMIRE) for near-field communications. However, the high permittivity does not diminish the radiated far-fields. The effective current of the piezoelectric antenna 300 is extracted from COMSOL simulations in conjunction with the displacement profile measured with a Polytec OFV-5000 laser vibrometer. The expected magnetic field is then calculated from the effective current under the assumption that the piezoelectric disc 304 radiates like an infinitesimal dipole and is within 5% of the measured far-field magnetic field given in Equation (3). Therefore, the high permittivity does not appear to diminish the radiated fields, and as more efficient materials, designs, and power handling schemes are implemented, scaling the link distance is much more promising than for conventional ESAs.

To achieve orders of magnitude distance scaling without greatly increasing the size of transmitters, better designs are needed to harness the ultimate efficiency of piezoelectric antennas, which theoretically can be orders of magnitude greater than demonstrated here. In particular, higher coupling coefficient modes and materials provide significant promise for increasing efficiency. The demonstrated contour mode, where the piezoelectric antenna employs a PZT disc, is presented as a proof-of-concept and to lay the groundwork for piezoelectric antennas. From Equation (5), maximizing resonator designs and materials with higher $d^2 C^E Q$ products leads to improvements in efficiency. For the PZT disc utilized for the piezoelectric antenna 300, reconfiguring the volume to more efficiently excite the thickness resonant mode (via the $d_{33}$ coupling coefficient) could provide nearly an order of magnitude efficiency enhancement because $d_{33} \sim 3 d_{31}$.

In additional embodiments, other materials such as PMN-PT with piezoelectric coupling coefficients more than 10 times higher than PZT have the potential for even more drastic efficiency enhancement. Although the quality factors of commercially available relaxer ferroelectric materials such as PMN-PT are currently low (typically <100), recent research on ion doping has shown promise to enhance Q in high-coupling ferroelectric materials such as manganese doped PMN-PZT (d=1140 picocoulomb/newton (pC/N), C=120 gigapascal (GPa), quality factor (Q)=1050), which has been demonstrated with a $d^2 C^E Q$ radiation efficiency product 45 times larger than the PZT demonstrated here. Although the moderate Qs limit the power handling due to increased heat dissipation, the total radiated power scales with radiation efficiency. Furthermore, the modest quality factors provide the potential for larger bandwidths, enabling higher data rates and simpler frequency synchronization in piezoelectric antenna arrays. Modulation of the piezoelectric antenna 300 is demonstrated herein with continuous phase binary frequency-shift keying (or CFBFSK) in order to avoid amplitude settling. The directly modulated piezoelectric antenna 300 achieved modulation rates of up to 60 bps, which could potentially be increased to beyond 1 kbps in PMN-PT antennas without loss of efficiency. If much faster modulation rates are required, implementing additional circuitry such as reactive tuning elements to further decrease settling times or improving the receiver demodulation scheme can be adopted.

In summary, the presented piezoelectric antenna 300 and/or apparatus 400 demonstrate the potential for portable VLF transmitters that have been unattainable for decades. The framework provided here fully outlines the design space for an acoustically-driven and modulation-inducible radiating elements (ADMIREs) and provides a roadmap to achieve orders of magnitude further improvement in radiation efficiency and modulation rate through the implementation of different vibrational modes and materials with high FoM. Although the current measurement distance is limited, the short standoff is primarily limited by power handling considerations and is not indicative of the ultimate communication distance of acoustic antennas. Thermal dissipation in the demonstrated piezoelectric antenna 300 and apparatus 400 limit the input power to be well below the mechanical (ultimate stress) or electrical (breakdown) driving limits. Improving temperature control to achieve greater power handling or implementing parallel arrays of disclosed piezoelectric antennas, where phase synchronization is simplified by the moderate Q, can enable orders of magnitude improvement in the piezoelectric antenna range. While this work is demonstrated at the upper end of the VLF range, using the provided theoretical framework and proposed FoM, this work can be applied to different frequencies by scaling the dimensions of the acoustic antennas. In some embodiments, as the operating frequency is determined by the length of the antenna along the resonant axis, increasing the operating frequency results in more compact antennas suitable for portable applications. The efficiency advantage over electrical state-of-the-art at both higher and lower frequencies can be maintained provided appropriate materials and designs are utilized, exhibiting great potential for numerous wireless IoT applications.

Modeling.

Piezoelectricity and EM radiation modeling require multidisciplinary understanding and coupling between the electrical and the mechanical domains. This is achieved by using FEM available from "COMSOL Multiphysics" that couples these domains in the "piezoelectric devices" toolbox. This toolbox solves the piezoelectric constitutive equations either in its stress-charge or strain-charge forms. Such a model can be used to determine the resonance frequency of the structure using Eigen frequency simulations followed by frequency domain simulations to find out parameters such as induced stress/strain, the velocity at the edge of the disc, internal polarization, surface voltages, and admittance. Two types of boundary conditions (BC) are set to run frequency-domain simulations: electrical BC and mechanical BC. Electrically, an arbitrary voltage amplitude is applied to the top electrode while the bottom electrode is grounded (all the parameters scales linearly with voltage) and all other surfaces are electrically floating.

On the mechanical side, a free BC is assigned to the whole PZT disk to reduce any anchor damping and a material damping is assigned to PZT (see Supplemental Information for a detailed figure). The internal polarization (charge density) can then be used to calculate the polarization current and the radiated EM field from Equations (2) and (3). PZT piezoelectric properties are supplied by the vendor (see Supplemental Information) and input to the FEM model. The material damping (quality factor) is modified so that the motional resistance $R_m$, calculated using Equation (4), matches the measured value. The simulation time can be dramatically reduced since the designed PZT disc exhibits symmetry around its central axis so, axisymmetric simulations are utilized. In addition, an air sphere is added to model the surrounding of the piezoelectric antenna 300, which enables near-field electrostatic simulations around the piezoelectric antenna to compare air breakdown around different piezoelectric materials. The size of the air sphere is much smaller than the crossover point so that the radiated power is much smaller than the near-field reactive power and other losses in the device and can be neglected. Simulated admittance is compared to measured admittance in FIG. 6. Moreover, the simulated near-field of PZT is compared with the infinitesimal dipole near-field in FIG. 9.

PZT Fabrication and Characterization.

The PZT discs used in experiments are commercially fabricated by Physik Instrumente™ (PI) and made from their PIC181 material. It is a hard PZT chosen to balance the mechanical quality factor and the electromechanical coupling. The commercial discs have an 8 cm diameter and a 1 cm thickness with both top and bottom surfaces fully metalized with about 20 μm thick of silver. Patterning of the silver is conducted using an end mill to remove the interior metal until only the desired 0.5 cm ring along the edge remains. Two wire leads are split from a BNC cable and soldered to the top and bottom metal surfaces to provide electrical excitation, with the lead lengths minimized to reduce near-field radiation from the current loop.

During testing, the PZT disc operates with mechanically-free boundary conditions, such that all moving surfaces are free to move without constraint which theoretically results in the lowest damping and highest Q. The mechanically-free boundary condition is achieved by resting the bottom center of the resonator on a small piece of foam, e.g., the foam piece 425. In theory, the center of the disc where the lateral displacement is zero (nodal point) is the optimal contact point. The lack of motion results in negligible surface friction and thus does not affect the resonance mode. Multiple mounting configurations were considered, with the small foam base ultimately chosen for simplicity as it was experimentally verified to not reduce resonator Q and resonator quality factor approached the theoretical limit set by the manufacturer. Other embodiments are envisioned where the piezoelectric disc 300 or 400 is secured in place while still allowing the middle of the piezoelectric disc sufficient room surrounding the piezoelectric disc for vibration.

Characterization of the PZT is conducted by connecting a Tektronix AFG3152C function generator (e.g., the function generator 1020) directly to the top and bottom electrodes via BNC cable. An Agilent E4445A spectrum analyzer (e.g., the SSA 1032) connected in series with the PZT disc can then be used to characterize the impedance of the PZT disc. The spectrum analyzer measures the power spectrum as a function of frequency which is then used to calculate the magnitude of the impedance of the piezoelectric disc 300 or 400. The measured power spectrum is then fit using the BVD model from which the motional resistance, electromechanical coupling ($k_t^2$), and mechanical quality factor are extracted. The bottom surface of the PZT disc rests freely on a 2×2 cm insulating cardboard lattice and the top and side surfaces are unconstrained. Multiple clamping configurations were considered but yielded negligible changes in mechanical properties. Input power to the PZT disc is characterized by removing the series spectrum analyzer and adding an Agilent MSO7104B oscilloscope in parallel with the piezoelectric disc with the power dissipation measured from the voltage drop across the piezoelectric disc.

Radiation Measurement.

Wireless radiation measurements of the generated magnetic field are conducted in an open environment to minimize scattering and noise. Confinement of the near-field component of the PZT radiation results in the far-field component dominating beyond 2 m but current loops in the transmitter exhibit near-field dominate radiation up to 1000 meters. In order to minimize near-field radiation from current loops, leads and connections are minimized and oriented to exhibit radiation orthogonal to the receiving antenna. The resulting total radiation exhibits a near-to-far-field crossover between 1 and 2 meters. At the operating frequency, only the PZT radiation can exhibit a 1/R roll off at distances less than 1 km, therefore all measured radiation with a 1/R fit is attributed solely to the PZT.

As discussed with reference to FIG. 7, the transmitting system can include a Tektronix AFG3152C function generator (e.g., the function generator 720) connected in series to a 50×Trek model 2100HF amplifier (e.g., the amplifier 730) to generate a sufficiently large excitation to measure the far field. The amplifier 730 presents a resistance of 200Ω in series with the 63Ω motional resistance of the PZT disc at resonance, resulting in a diminished loaded quality factor where $Q_L=QR_m/(R_m+R_s)$. From Equation (5), the diminished $Q_L$ results in a lower radiation efficiency for the PZT disc and a higher power is needed to drive the loaded piezoelectric antenna 300.

In some embodiments, the magnetic field is measured using an AH-Systems SAS-565L 24" shielded passive loop antenna (e.g., the loop antenna 750), which is oriented to receive the maximum signal from the PZT far-field component. Incident radiation induces an open circuit voltage across the antenna terminals proportional to the field strength. The antenna factor of the loop receiver is calibrated by the manufacturer post-production to be 1.74 $\Omega^{-1}$ m$^{-1}$ at 33 kHz and is used to extract the measured B-field where $B_{RMS}=AF\mu_0 V_{RMS}$. The open-circuit voltage of the piezoelectric antenna 300 can be measured using a Stanford Research Systems SR865A lock-in amplifier (e.g., the lock-in amplifier 760) that is frequency locked to the transmitting PZT disc and employs a 24 dB/octave bandpass filter to attenuate noise around the locked frequency. Measurements were made at 1 m distance intervals for 2 minutes at a time using a 1 second time constant. The measured B-field strength is extracted from the average terminal voltage over the 2-minute measurement window, with one ("1") standard deviation error bars also provided to account for variance in the measured field strength due to noise. Between field measurements, the noise floor is measured at 1-minute intervals with the input signal turned off (see FIG. 16). Measurements beyond 6 meters exhibit a signal-to-noise ratio less than 2 and are not shown.

Modulation Measurement.

Direct digital modulation of the disclosed piezoelectric antenna can be done by altering amplitude, frequency, and phase of the excitation signal which in turn modulates the mechanical resonance of the piezoelectric antenna and thus radiated signal. Herein, we focus on BFSK since it has a continuous phase, which lowers the mechanical settling time compared to both BPSK and BASK, although the latter can still be employed. The modulation is evaluated using the measurement setup in FIG. 10. The measurement setup 1000 can include a Tektronix AFG3152C function generator (e.g., the function generator 1020) that directly excites the piezoelectric disc 304 or 404 with continuous phase BASK or BFSK signals. A Polytec OFV-5000 laser vibrometer (e.g., the optical vibrometer 1026) is used to measure the velocity of the PZT edge while vibrating in the dilation mode. The two BFSK modulation frequencies are chosen to be within the 3 dB bandwidth as shown in FIG. 11. FIG. 12 shows the modulated velocity of BASK and BFSK with a 10 Hz modulation rate. The velocity signal is then input to a ROHDE and SCHWARZ FSUP signal source analyzer (e.g., the signal source analyzer 1032) with FM demodulation capability to demodulate the signal as shown in FIG. 13A and FIG. 13B (bottom figures) for 5 Hz and 20 Hz BFSK rates, respectively. Moreover, the peak-to-peak frequency difference after demodulation at different FSK rates is shown in FIG. 14.

Figure 15:
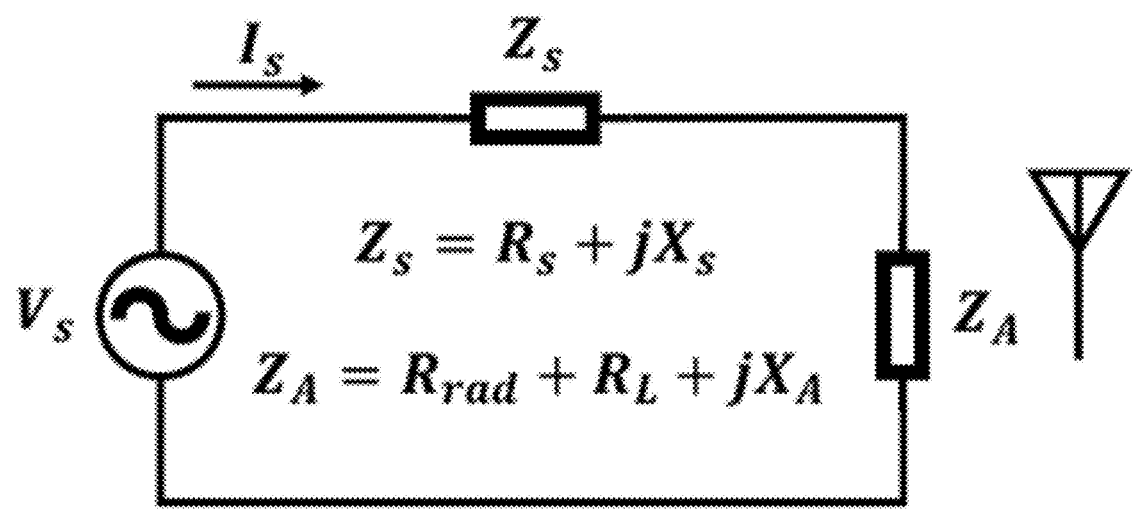
FIG. 15 is an electrical schematic diagram of a general antenna equivalent circuit model used to derive matched total antenna efficiency of the piezoelectric antenna relative to an equivalent ESA based on an infinitesimal dipole according to an embodiment.

FIG. 15 is an electrical schematic diagram of a general antenna equivalent circuit model used to derive matched total antenna efficiency of the piezoelectric antenna 300 (or apparatus 400) relative to an equivalent ESA based on an infinitesimal dipole according to an embodiment. In various embodiments, the equivalent circuit model is used to derive the matched total antenna efficiency of the piezoelectric antenna 300 relative to an equivalent ESA based on an infinitesimal dipole. In one embodiment, $Z_A$ is the antenna complex impedance and $Z_s$ is the source complex impedance.

Matched total antenna efficiency is a measure of both how efficiently power can be delivered from a source to the antenna and how well the antenna radiates the power delivered to it:

$$\xi_{tot} = \xi_\Gamma \xi_{rad} = \frac{P_{del}}{P_{av}} \frac{P_{rad}}{P_{del}} = \frac{P_{rad}}{P_{av}} \quad (11)$$

Therefore the matched total efficiency of the antenna, $\xi_{tot}$, can be defined as the product of the mismatch efficiency, $\xi_\Gamma$, and the radiation efficiency, $\xi_{rad}$, where $P_{av}$, $P_{del}$, $P_{rad}$ are the power available from the source, power delivered to the antenna and power radiated by the antenna respectively.

The radiated power from an antenna can be defined as:

$$P_{rad} = \frac{|I_s|^2 R_{rad}}{2} = \frac{|V_s|^2}{2}\left(\frac{R_{rad}}{(R_{rad}+R_L+R_s)^2+(X_A+X_S)^2}\right), \quad (12)$$

where the circuit elements are shown in FIG. 15. Maximum radiated power occurs for the case of a lossless antenna ($R_L=0$) with a conjugate match between the source and antenna impedances ($Z_A=Z_S^*$) such that all the power available from the source, Vs, is delivered to the antenna and fifty percent of the power is dissipated in the source resistance, Rs. This maximum theoretical limit is the same for both the piezoelectric and ESA antennas using the same source.

The piezoelectric antenna is matched so that $X_A=X_S=0$, and the antenna losses are represented by the motional resistance ($R_L=R_m$). Equation (12) can be modified for the piezoelectric antenna (ADMIRE) as follows:

$$P_{rad}^{ADMIRE} = \frac{|V_s|^2}{2}\left(\frac{R_{rad}^{ADMIRE}}{\left(R_{rad}^{ADMIRE}+R_m+R_s\right)^2}\right). \quad (13)$$

On the other hand, infinitesimal dipole antennas require matching to cancel out the large reactive part that occurs in non-resonant ESAs. In that case $X_A=-X_s$ and $R_L=R_{loss}+R_{match}$ where $R_{loss}$ represents the ESA conduction/dielectric losses and $R_{match}$ is the loss due to the finite quality factor of the matching element. Equation (12) can be modified for ESAs as follows:

$$P_{rad}^{ESA} = \frac{|V_s|^2}{2}\left(\frac{R_{rad}^{ESA}}{\left(R_{rad}^{ESA}+R_{loss}+R_{match}+R_s\right)^2}\right). \quad (14)$$

ESA is used here for comparison. Using all previously stated assumptions and dividing (3) by (4), the matched total antenna efficiency ratio, which is the ratio of radiated power from ADMIRE to radiated power from ESA using the same source, is expressed as:

$$\xi_{tot}^{rel} = \frac{\xi_{tot}^{ADMIRE}}{\xi_{tot}^{ESA}} = \frac{P_{rad}^{ADMIRE}}{P_{rad}^{ESA}} = \frac{R_{rad}^{ADMIRE}}{R_{rad}^{ESA}} \frac{\left(R_{rad}^{ESA}+R_{loss}+R_{match}+R_s\right)^2}{\left(R_{rad}^{ADMIRE}+R_m+R_s\right)^2}. \quad (15)$$

The matched efficiency boost of the piezoelectric antenna 300 (or apparatus 400) is calculated using Equation (15) in conjunction with Equations (16)-(23), as follows.

$$R_{rad}^{ADMIRE} = \frac{R_{rad}}{n^2} \quad (16)$$

$$B_{rad} = 320\pi^2\left(\frac{d_{ij}C_{jj}^H A_{PZT}}{\lambda}\right)^2 \quad (17)$$

$$\eta^2 = 4\frac{C_{jj}^H A_{PZT}}{L_{PZT}}C_o k_t^2 \quad (18)$$

$$R_m = \frac{\pi^2}{8\omega_\gamma C_o k_t^2 Q} \quad (19)$$

$$R_{\gamma ad}^{ESA} = 80\pi^2 \left(\frac{L_{BSA}}{\lambda}\right)^2 \quad (20)$$

$$R_{march} = \frac{|X_A|}{O_{inductor}} \quad (21)$$

$$X_A = -\frac{120\lambda}{\pi L_{ESA}}\left[\ln\left(\frac{L_{ESA}}{2r_{ESA}}\right) - 1\right] \quad (22)$$

$$R_{loss} = \frac{L_{BSA}}{\sigma_c A_{ESA}} \quad (23)$$

where $B_{ract}$, $\eta^2$ are the mechanical damping coefficients and the electromechanical coupling coefficient of the piezoelectric antenna respectively, $\omega_r = 2\pi \times 33$ kHz is the resonant frequency for both antennas, and $\lambda$ is the free space wavelength of the electromagnetic radiation. The piezoelectric coefficient, $d_{ij}$, and stiffness constant, $C_{jj}^E$, are given generally in (17) since different, or even multiple, piezoelectric coefficients and stiffness constants can be used to generate a magnetic field. For the PZT disc (e.g., the piezoelectric disc 304) demonstrated here operating in the dilation mode, analytical calculations indicate, and FEM simulations confirm, that $d_{31}$ and $C_{11}^E$ are the dominant contributors to radiation. The ESA is assumed to be made from copper with bulk conductivity, $\sigma_c$, and matched with an inductor with a Q of 200. Using Equations (16)-(23), in conjunction with Table 1 and $R_s = 50\Omega$, yields an improvement in matched antenna efficiency of more than 6400 times.

The previous discussion assumes the same source for both piezoelectric antenna and ESA with the same source resistance and same available power for radiation where the matched efficiency is defined as the ratio of power radiated to the maximum power available for radiation. An alternative way to define the matched efficiency ratio would be to consider defining the matched total efficiency as the radiated power to input power ratio assuming different power sources are available that can match each type of antenna separately. In that case Equation (15) can be modified as follows:

$$\xi_{tot}^{rel} = \frac{R_{rad}^{ADMIRE}(R_{rad}^{ESA} + R_{loss} + R_{match} + R_s^{ESA})}{R_{rad}^{ESA}(R_{rad}^{ADMIRE} + R_m + R_s^{ADMIRE})}, \quad (24)$$

which results in 56 times matched antenna efficiency improvement if compared with ESA, where $R_S^{ESA} = R_{rad}^{ESA} + R_{loss} + R_{match}$ and $R_S^{ADMIRE} = R_{rad}^{ADMIRE} + R_m$.

The piezoelectric antenna parameters are either characterized by the manufacturer (*) or measured post-fabrication.

TABLE 1

Piezoelectric Antenna Parameters for Matched Efficiency Calculation

| $d_{31}$ | $C_{11}^E$ | PZT | PZT | PZT | $t$ | $\eta^2$ | $C_o$ |
|---|---|---|---|---|---|---|---|
| 108* pC/N | 152.3* GPa | 3.5 cm | 2 PZT | 1 cm | 3.7% | | 1.8 nF |

TABLE 2

ESA Parameters for Matched Efficiency Calculation

| ESA $L_{ESA}$ | ESA $r_{ESA}$ | ESA | $\sigma_c$ | inductor Q |
|---|---|---|---|---|
| 8 cm | 0.5 cm | 2 ESA | $5.9 \times 10^7$ S/m | 200 |

As was discussed, pC/N are picocoulombs per newton, GPa are gigapascals, and further S/m are Siemens per meter.

The PZT discs (PIC-181) were bought commercially from PI ceramics. Relevant material properties for the piezoelectric antenna design are given below. The demonstrated PZT-based piezoelectric antenna utilizes $d_{31}$ for proof of concept and is far from the conceivable limit for acoustically driven antennas. As seen from Equation (17), incorporating different $d_{ij}$ provides the potential for a further order of magnitude improvement in radiation efficiency.

$$\varepsilon_\gamma^T = \begin{bmatrix} 1224 & 0 & 0 \\ 0 & 1224 & 0 \\ 0 & 0 & 1135 \end{bmatrix}$$

$$\varepsilon_\gamma^s = \begin{bmatrix} 740 & 0 & 0 \\ 0 & 740 & 0 \\ 0 & 0 & 624 \end{bmatrix}$$

$$d = \begin{bmatrix} 0 & 0 & 0 & 0 & 389 & 0 \\ 0 & 0 & 0 & 389 & 0 & 0 \\ -108 & -108 & 253 & 0 & 0 & 0 \end{bmatrix} pC/N$$

$$e = \begin{bmatrix} 0 & 0 & 0 & 0 & 475 & 0 \\ 0 & 0 & 0 & 475 & 0 & 0 \\ -120 & -120 & 265 & 0 & 0 & 0 \end{bmatrix} C/m^2$$

$$S^E = \begin{bmatrix} 11.75 & -4.07 & -4.996 & 0 & 0 & 0 \\ -4.07 & 11.75 & -4.996 & 0 & 0 & 0 \\ -4.996 & -4.996 & 14.11 & 0 & 0 & 0 \\ 0 & 0 & 0 & 35.3 & 0 & 0 \\ 0 & 0 & 0 & 0 & 35.3 & 0 \\ 0 & 0 & 0 & 0 & 0 & 31.6 \end{bmatrix} pm^2/N$$

$$C^E = \begin{bmatrix} 152.3 & 89.09 & 85.47 & 0 & 0 & 0 \\ 89.09 & 152.3 & 85.47 & 0 & 0 & 0 \\ 85.47 & 85.47 & 134.1 & 0 & 0 & 0 \\ 0 & 0 & 0 & 28.3 & 0 & 0 \\ 0 & 0 & 0 & 0 & 28.3 & 0 \\ 0 & 0 & 0 & 0 & 0 & 31.61 \end{bmatrix} GPa$$

Figure 16:
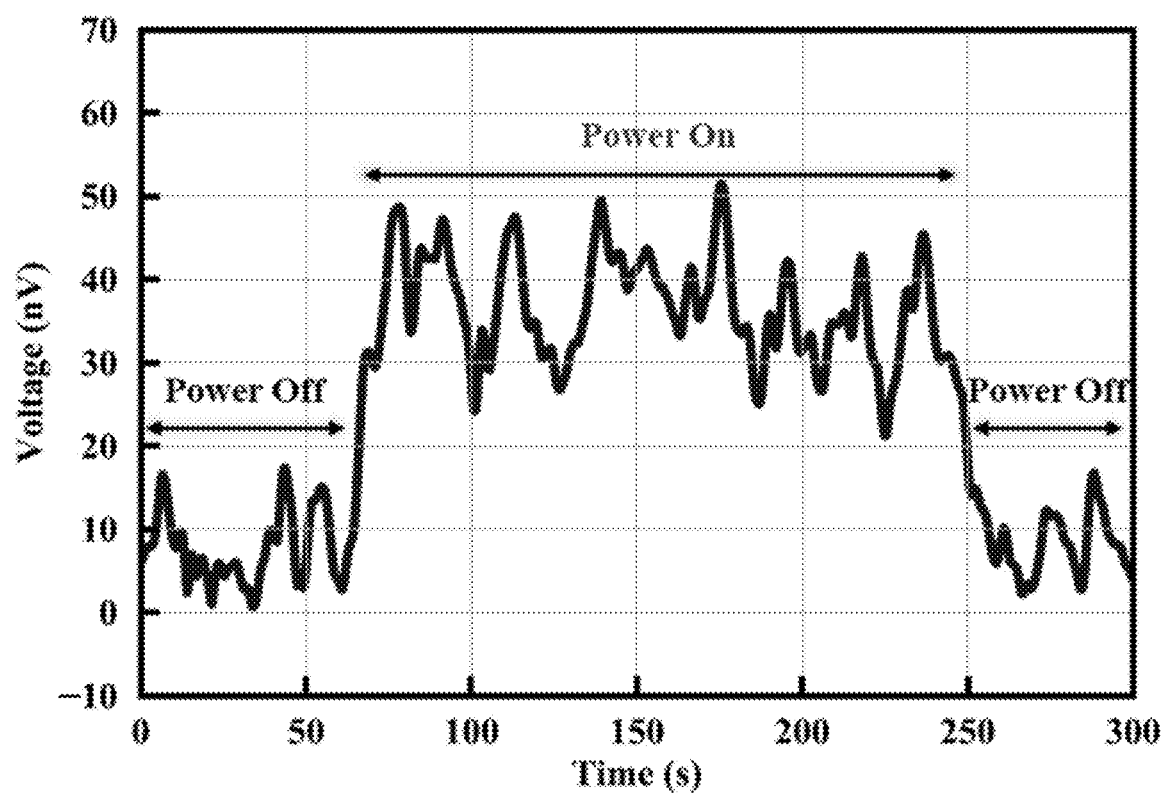
FIG. 16 is a graph illustrating a sample of a measured voltage from a lock-in amplifier of the piezoelectric antenna versus time at two meters according to an exemplary embodiment.

FIG. 16 is a graph illustrating a sample of a measured voltage from a lock-in amplifier of the piezoelectric antenna versus time at two meters according to an exemplary embodiment. We sampled measured voltage from the lock-in amplifier versus time at 2 meters between the loop antenna 750 and the piezoelectric disc 300 (FIG. 7). FIG. 16 illustrates the measured voltage from the antenna terminals from which the measured magnetic field is extracted using the antenna factor. Both the field measurements (power on) and noise (power off) are post-processed and extracted. Average noise floor is less than 10 nanovolts (nV).

Figure 17:
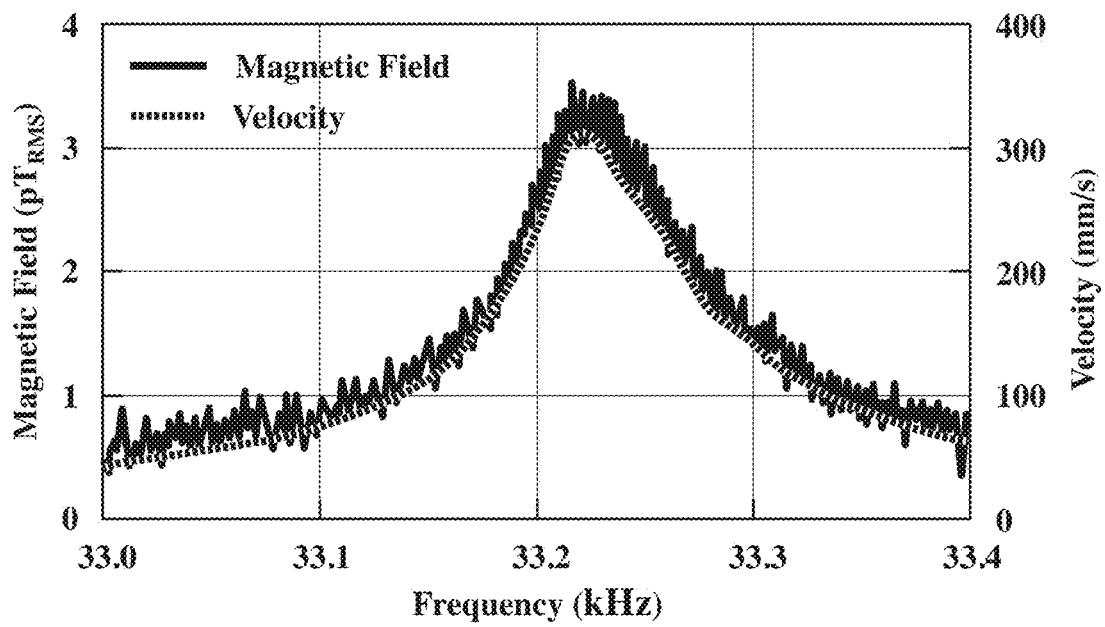
FIG. 17 is a graph illustrating a magnetic field and velocity frequency responses of the piezoelectric antenna according to some embodiments.

FIG. 17 is a graph illustrating a magnetic field and velocity frequency responses of the piezoelectric antenna according to some embodiments. The magnetic field frequency response is at 1 m (indoors) measured with the loop antenna 750 connected to the spectrum analyzer 1032. At the same time, the disk edge velocity is measured using an optical interferometer (drive voltage=25 V peak-to-peak). Thus, FIG. 17 illustrates the magnetic field frequency response at 1 m (indoors) that is radiated by the PZT disc measured with the loop antenna 750 connected to the spectrum analyzer 1032 while at the same time the disc edge velocity is measured using an optical interferometer. Illustrated is a complete correlation between the two frequency responses. The used drive voltage is 25 V peak-to-peak and the frequency sweep range is limited by the noise floor of the spectrum analyzer.

Figure 18:
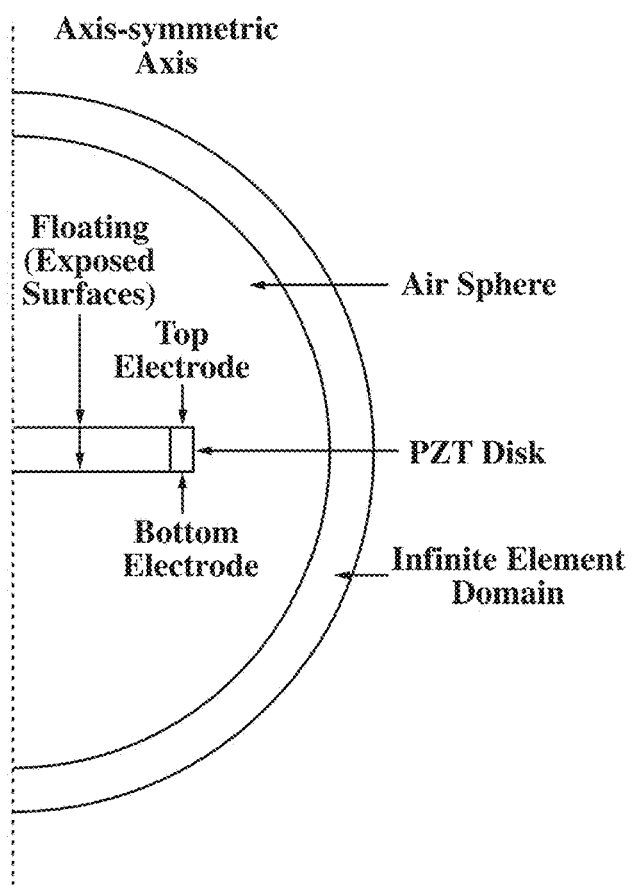
FIG. 18 is a side view diagram of an axis-symmetric simulation region of the piezoelectric antenna according to an embodiment.

FIG. 18 is a side view diagram of an axis-symmetric simulation region of the piezoelectric antenna according to an embodiment. Air around PZT disc is represented as a half circle. An arbitrary voltage amplitude is applied to the top electrode while the bottom electrode is grounded and all other surfaces are floating. A free mechanical boundary condition is assigned to the whole PZT disc to reduce any anchor damping.

Figure 19A:
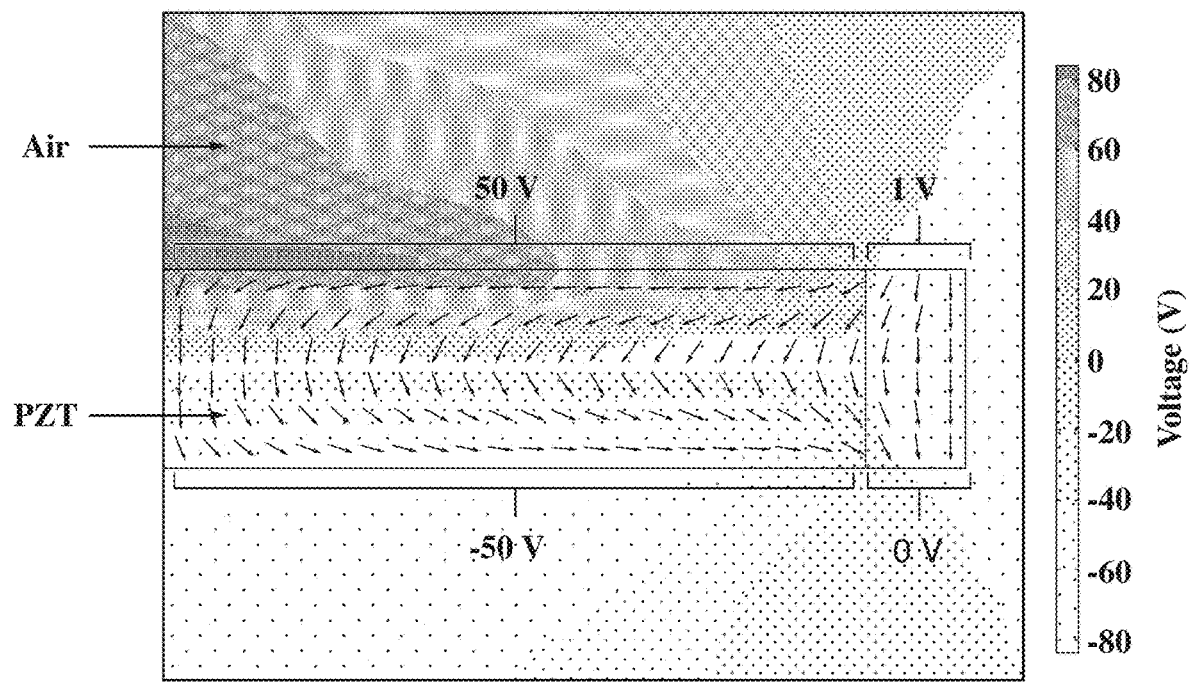
FIG. 19A is a side view diagram of an axis-symmetric simulation region of the piezoelectric antenna illustrating electric field concentrations within and outside of the piezoelectric antenna according to an embodiment.
Figure 19B:
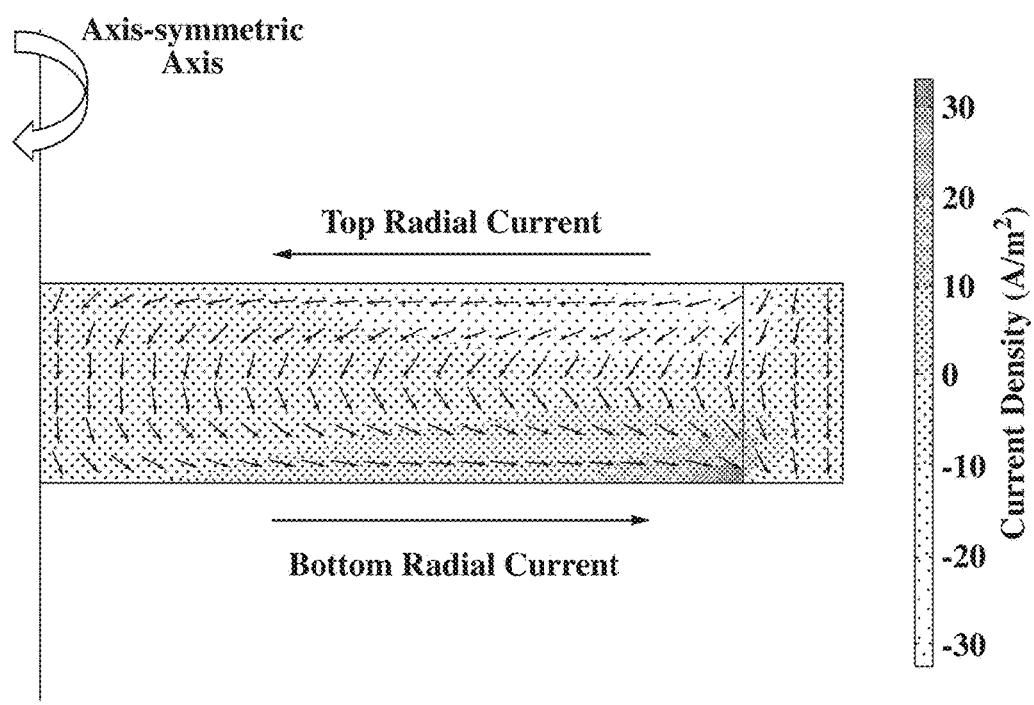
FIG. 19B is a side view diagram an axis-symmetric region of the piezoelectric antenna illustrating current density within the piezoelectric disc according to an embodiment.

FIG. 19A is a side view diagram of an axis-symmetric simulation region of the piezoelectric antenna illustrating electric field concentrations within and outside of the piezoelectric antenna according to an embodiment. FIG. 19B is a side view diagram an axis-symmetric region of the piezoelectric antenna illustrating current density within the piezoelectric disc according to an embodiment. There are additional significant currents that can be explained to show that the intended radiating element (e.g., the piezoelectric disc 304) is the only element that is being measured. There will be large components of radial currents, but these currents will cancel each other as they have the same magnitude and opposite direction. This is clarified in FIGS. 19A-19B, which illustrates the surface voltage and radial current distribution on the cross-section of the piezoelectric disc 304.

As illustrated, the top and bottom radial currents cancel each other, the black arrows show the direction of displacement current within the PZT cross-section. Moreover, due to the axis-symmetry nature of the disk (imagine the cross-section is revolved 3600 around the axis-symmetric axis), all the radial components cancel and the only remaining current will be the thickness directed component.

The current flowing in the leads is opposite in direction and ~20% in magnitude of the current in the exposed region. For the simulated case, the terminal current from the source equals the applied voltage divided by the motional resistance ~16 mA (confirmed by simulation), the polarization current in the exposed region is ~82 mA (confirmed with supplied equations in the manuscript and simulated using the voltage or electric field within the exposed region) as shown in FIG. 19A, where the surface voltage amplified by the quality factor reaches an average of ±50 V on the top/bottom exposed surfaces. This results in a 20% reduction in measured magnetic field.

The previous discussion assumes that the current in the leads contributes as a dipole, not as a loop because in our measurement setup we reduce the loop area and put it in an orientation that generates a magnetic field that is orthogonal to the receiver loop used to measure the magnetic field. This can be confirmed by the magnetic field measurement done that has 1/R magnetic field decay, which can never be due to the loop as theoretically loops have 1/R3 magnetic field decay in the near-field region. With all previous considerations in mind, we assume that the intended radiating element is the only element that is being measured.

Magnetic field calculations can be made from electrostatic simulations. Electric and magnetic field components for infinitesimal electric dipole radiation can be written as follows:

$$E_\theta = n \frac{ika\omega d}{4\pi r} \sin\theta \left(1 + \frac{1}{ikr} - \frac{1}{(kr)^2}\right) e^{-jkr} \quad (25)$$

$$H_\phi = \frac{ika\omega d}{4\pi r} \sin\theta \left(1 + \frac{1}{ikr}\right) e^{-jkr} \quad (26)$$

Figure 20:
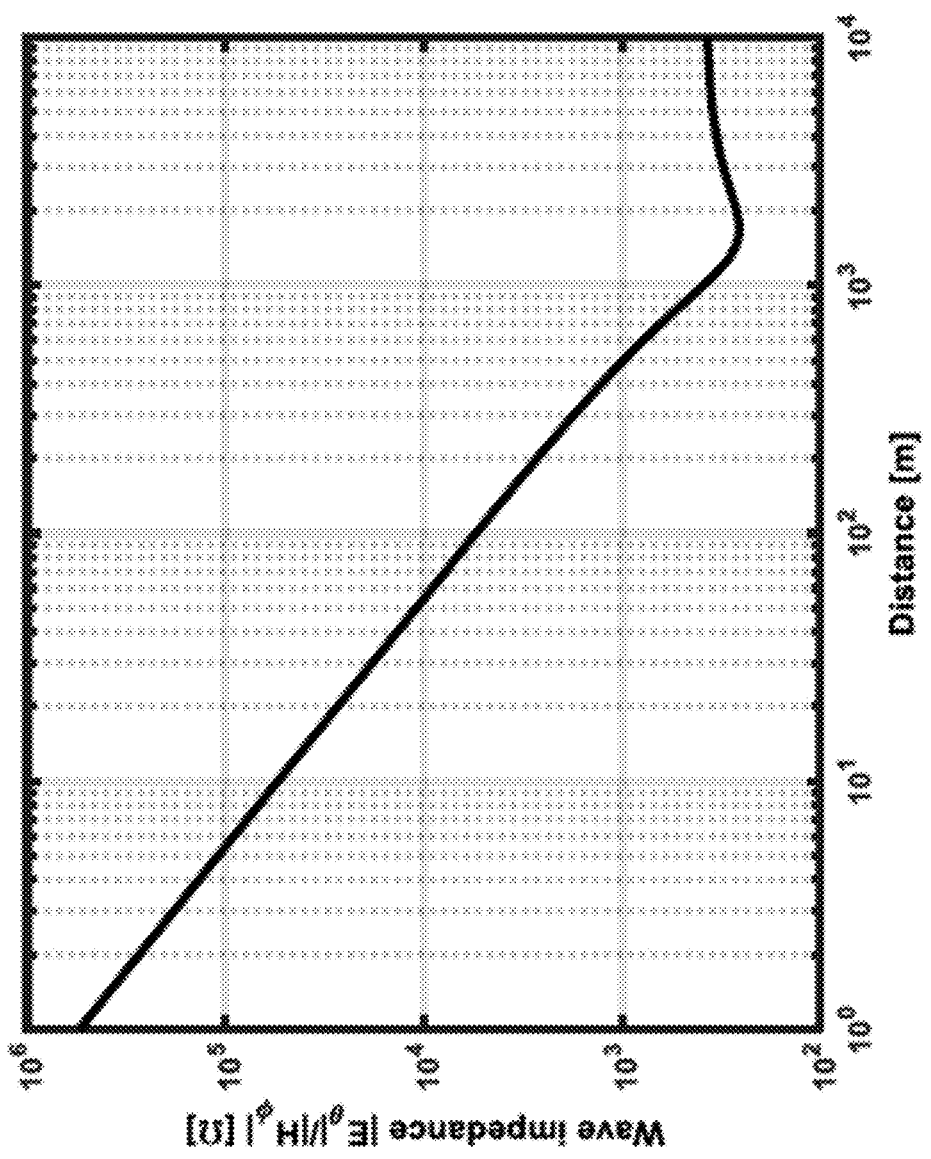
FIG. 20 is a logarithmic scale plot of wave impedance versus distance of the piezoelectric antenna according to an embodiment.

The wave impedance in air can be calculated as follows and plotted in FIG. 20:

$$\eta = \frac{|E_\theta|}{|H_\phi|} \quad (27)$$

Using the simulated near-field electric field and calculated wave impedance in air, we can calculate the corresponding magnetic field. Note that, the main assumptions here are, first, wave impedance is a material property and doesn't change if the material is fixed. The surrounding material is always air and the relative permittivity of the transmitter is the one that changes. So, by simulating the near-field in the air region and knowing the wave impedance the corresponding magnetic field can be calculated. Another assumption includes that the far-field component is only dependent on the current so changing the permittivity of the transmitter does not change the far-field as long as the current is fixed. The far-field is the first term in the brackets of Equations (25) and (26).

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an embodiment" or "one embodiment" or the like throughout is not intended to mean the same implementation or implementation unless described as such. One or more implementations or embodiments described herein may be combined in a particular implementation or embodiment. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:
1. An antenna comprising:
   a piezoelectric disc;
   a first ring-shaped electrode disposed along a circumference of a first surface of the piezoelectric disc; and a second ring-shaped electrode disposed along a circumference of a second surface of the piezoelectric disc that is opposite to the first surface, wherein the first ring-shaped electrode and the second ring-shaped electrode are to receive a time-varying voltage to excite a mechanical vibration in the piezoelectric disc, and wherein the piezoelectric disc is to radiate electromagnetic energy at a particular frequency responsive to the mechanical vibration.

2. The antenna of claim 1, wherein the particular frequency is between 20 kilohertz (kHz) and 40 kHz derived from acoustic resonance of the piezoelectric disc.

3. The antenna of claim 2, wherein a diameter of the piezoelectric disc is between 13.4 centimeter (cm) and 6.7 cm.

4. The antenna of claim 1, wherein a thickness of the piezoelectric disc is between 0.5 cm and 1.5 cm.

5. The antenna of claim 1, wherein the first ring-shaped electrode and the second ring-shaped electrode are metal, are between 0.25 cm and 0.75 cm wide, and between 10 microns ($\mu$m) and 30 $\mu$m thick.

6. The antenna of claim 1, wherein the piezoelectric disc is one of a lead zirconate titanate (PZT) disc or a magnesium niobate, lead titanate (PMN-PT) disc.

7. The antenna of claim 1, further comprising a foam piece, wherein the piezoelectric disc is one of resting on or encased within the foam piece.

8. An antenna comprising:
a foam piece;
a chunk of piezoelectric material one of resting on or encased within the foam piece;
a first electrode disposed on a first surface of the chunk; and
a second electrode disposed on a second surface of the chunk of piezoelectric material that is across the chunk of piezoelectric material from the first electrode, wherein the first electrode and the second electrode are to receive a time-varying voltage to excite a mechanical vibration in the chunk of piezoelectric material, and wherein the chunk of piezoelectric material is to radiate electromagnetic energy at a particular frequency responsive to the mechanical vibration.

9. The antenna of claim 8, wherein the chunk of piezoelectric material is one of a disc, a cube, a rectangular box, a sphere, a cylinder, or a half cylinder.

10. The antenna of claim 8, wherein the first electrode is attached along an outer perimeter of the first surface of the chunk of piezoelectric material and the second electrode is attached along an outer perimeter of the second surface of the chunk of piezoelectric material.

11. The antenna of claim 8, wherein the piezoelectric material has a relative permittivity greater than one thousand.

12. The antenna of claim 11, wherein the piezoelectric material is one of lead zirconate titanate (PZT) or magnesium niobate, lead titanate (PMN-PT).

13. An apparatus comprising:
a piezoelectric disc;
a first ring-shaped electrode attached along a circumference of a first surface of the piezoelectric disc;
a second ring-shaped electrode attached along a circumference of a second surface of the piezoelectric disc that is opposite to the first surface; and
a radio coupled to the first ring-shaped electrode and the second ring-shaped electrode, the radio to impart a time-varying voltage signal to excite a mechanical vibration in the piezoelectric disc that causes the piezoelectric disc to radiate an electromagnetic signal at a particular carrier frequency.

14. The apparatus of claim 13, wherein the radio comprises a modulator to modulate a bit stream of data onto the electromagnetic signal, and further comprising an amplifier coupled between the radio and the first and second ring-shaped electrodes, the amplifier to amplify a modulated time-varying voltage signal received from the radio.

15. The apparatus of claim 14, wherein the modulator employs continuous phase binary frequency-shift keying to modulate the bit stream of data onto the electromagnetic signal.

16. The apparatus of claim 13, wherein the particular carrier frequency is between 20 kilohertz (kHz) and 40 kHz derived from acoustic resonance of the piezoelectric disc, and wherein a diameter of the piezoelectric disc is between 13.4 centimeter (cm) and 6.7 cm.

17. The apparatus of claim 13, wherein the piezoelectric disc is comprised of a piezoelectric material having a relative permittivity greater than one thousand.

18. The apparatus of claim 13, wherein a thickness of the piezoelectric disc is between 0.5 cm and 1.5 cm.

19. The apparatus of claim 13, wherein the first ring-shaped electrode and the second ring-shaped electrode are metal, are between 0.25 cm and 0.75 cm wide, and between 10 microns ($\mu$m) and 30 $\mu$m thick.

20. The apparatus of claim 13, further comprising a foam piece, wherein the piezoelectric disc is one of resting on or encased within the foam piece.

* * * * *